United States Patent [19]

Aoki et al.

[11] Patent Number: 5,165,165
[45] Date of Patent: Nov. 24, 1992

[54] PART INSERTING APPARATUS AND METHOD FOR USE

[75] Inventors: Yasushi Aoki, Yokohama; Shozo Kasai, Kawasaki; Takeshi Yakou, Tokyo; Yusaku Azuma, Yokohama, all of Japan

[73] Assignee: Canon Kabushiki Kaisha, Tokyo, Japan

[21] Appl. No.: 531,572

[22] Filed: Jun. 1, 1990

[30] Foreign Application Priority Data

| Jun. 2, 1989 | [JP] | Japan | 1-139305 |
| Nov. 16, 1989 | [JP] | Japan | 1-296207 |
| Nov. 16, 1989 | [JP] | Japan | 1-296208 |
| Nov. 16, 1989 | [JP] | Japan | 1-296209 |
| Nov. 16, 1989 | [JP] | Japan | 1-296210 |

[51] Int. Cl.$^5$ .......... H05K 3/30; B23P 19/00
[52] U.S. Cl. .......... 29/838; 29/741; 29/566.3; 140/105
[58] Field of Search .......... 29/741, 837, 838, 705, 29/566.3

[56] References Cited

U.S. PATENT DOCUMENTS

| 4,165,557 | 8/1979 | Taguchi et al. | 140/105 X |
| 4,212,075 | 7/1980 | Cleversey et al. | 364/580 |
| 4,286,379 | 9/1981 | Kawa et al. | 29/741 X |
| 4,292,727 | 10/1981 | Maxner | 29/566.3 |
| 4,309,808 | 1/1982 | Dean et al. | 140/105 X |
| 4,356,619 | 11/1982 | Snyder et al. | 140/105 X |
| 4,464,829 | 8/1984 | Whittey et al. | 29/838 X |
| 4,557,043 | 12/1985 | Starski | 29/838 X |
| 4,574,462 | 3/1986 | Jackson | 29/566.3 |
| 4,590,660 | 5/1986 | Starski | 29/741 X |
| 4,622,740 | 11/1986 | Mirley, Jr. et al. | 29/741 X |
| 4,627,157 | 12/1986 | Campisi et al. | 29/838 X |
| 4,745,679 | 5/1988 | Shinanu et al. | 29/741 |
| 4,749,141 | 5/1988 | Musiani | 29/838 X |

FOREIGN PATENT DOCUMENTS

| 57-26400 | 6/1982 | Japan . |
| 60-32399 | 2/1985 | Japan . |
| 61-67985 | 4/1986 | Japan . |
| 62-52970 | 4/1987 | Japan . |
| 62-31837 | 7/1987 | Japan . |
| 62-158864 | 10/1987 | Japan . |
| 63-29840 | 6/1988 | Japan . |
| 64-1262 | 1/1989 | Japan . |
| 1-56850 | 12/1989 | Japan . |
| 1-60379 | 12/1989 | Japan . |
| 2-8669 | 3/1990 | Japan . |

*Primary Examiner*—Carl J. Arbes
*Attorney, Agent, or Firm*—Fitzpatrick, Cella, Harper & Scinto

[57] ABSTRACT

A parts inserting apparatus of this invention includes clinch elements arranged to be engaged with lead wires of an electronic part inserted into a printed circuit board, a detecting unit for detecting completion of insertion of the lead wires into the printed circuit board, a driving unit, connected to the clinch elements, for engaging the clinch elements with the lead wires to bend the lead wires, and a control unit for driving the driving unit to perform a clinch operation for bending the lead wires after the detecting unit detects completion of insertion of the lead wires.

34 Claims, 27 Drawing Sheets

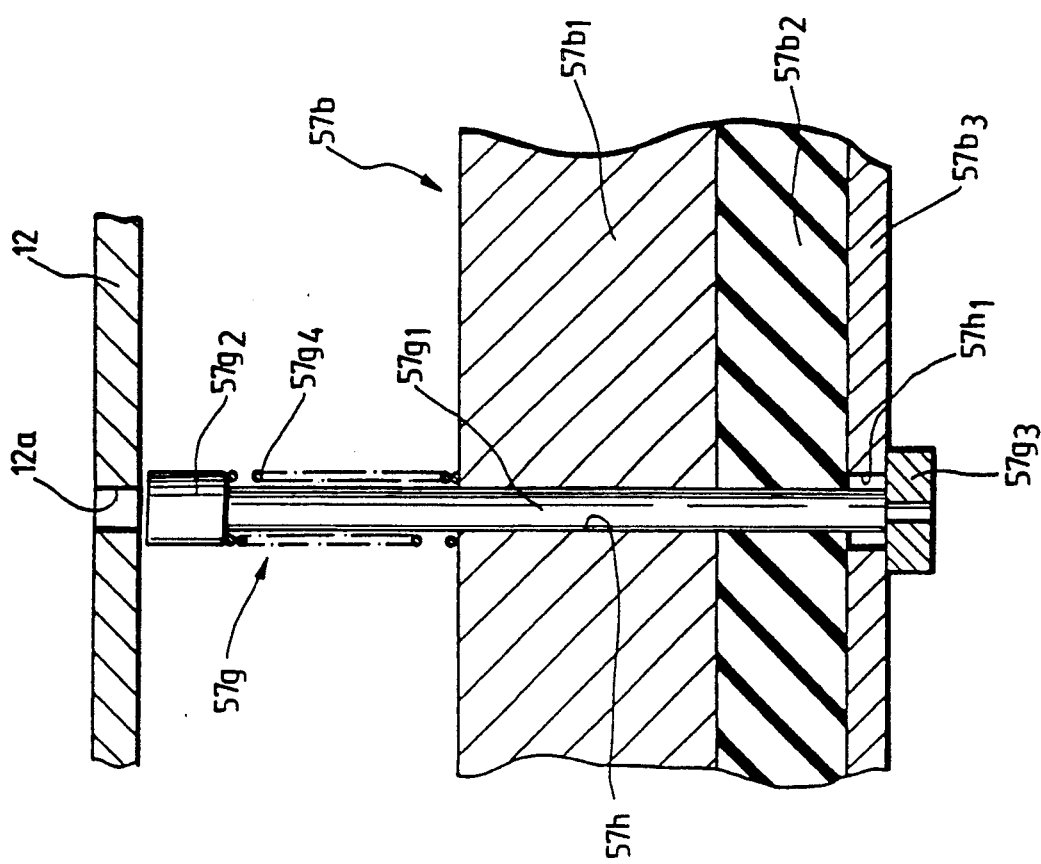
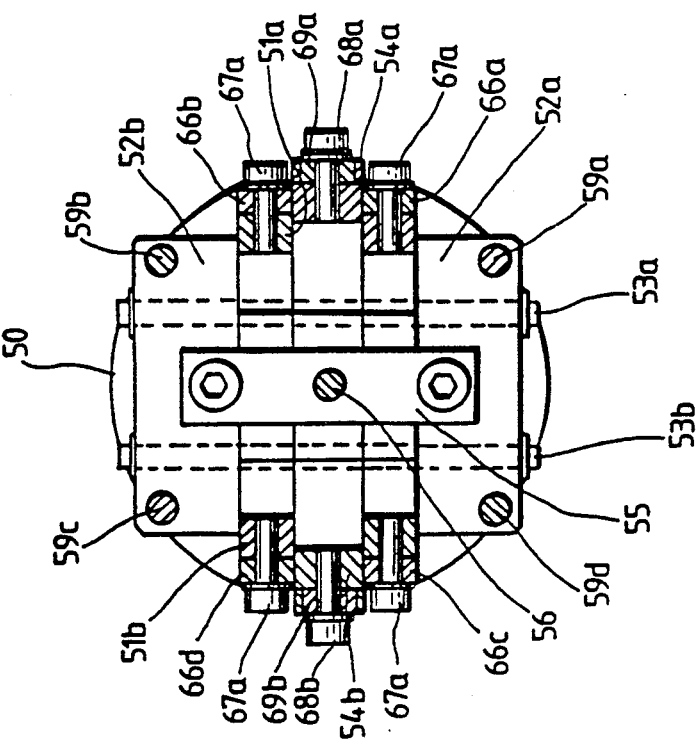

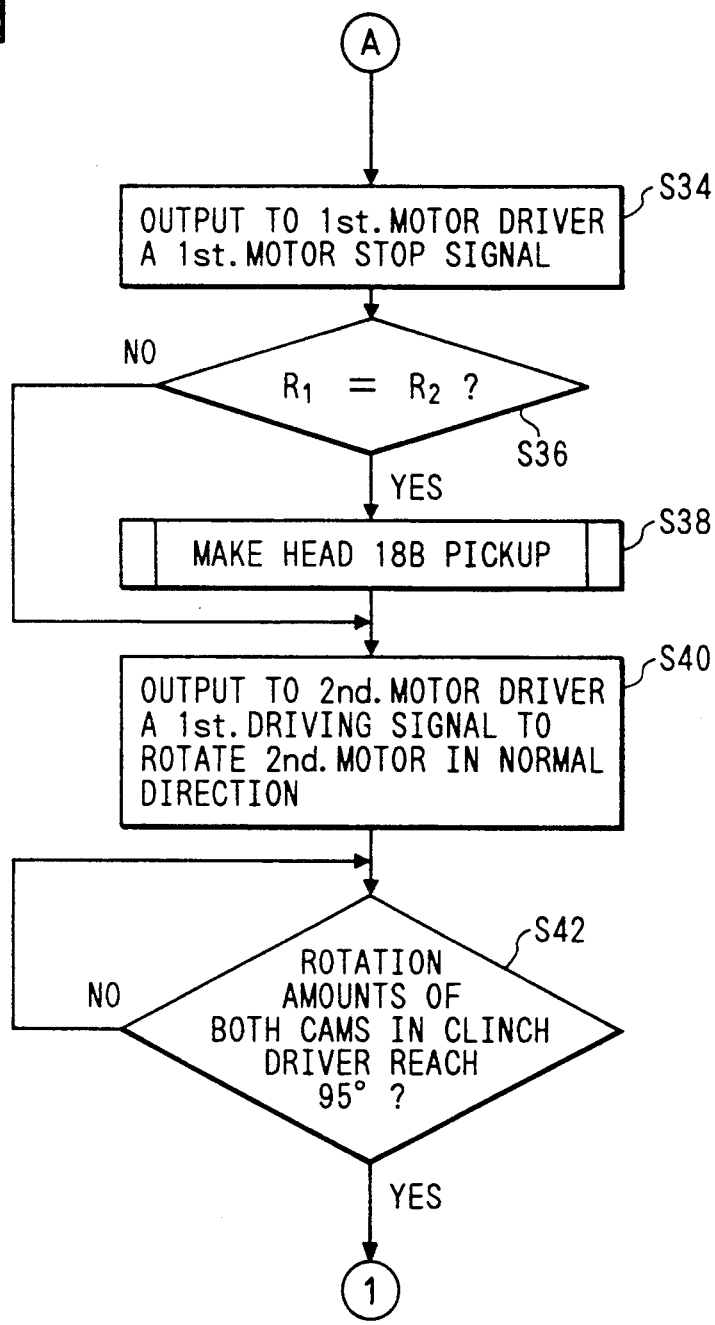

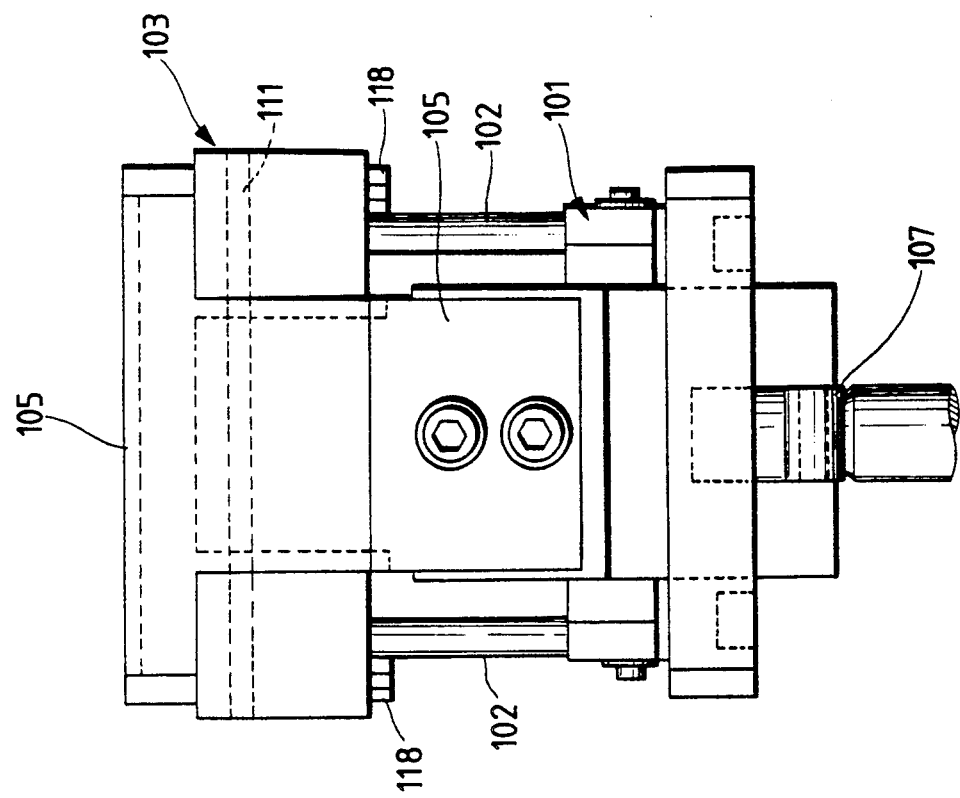
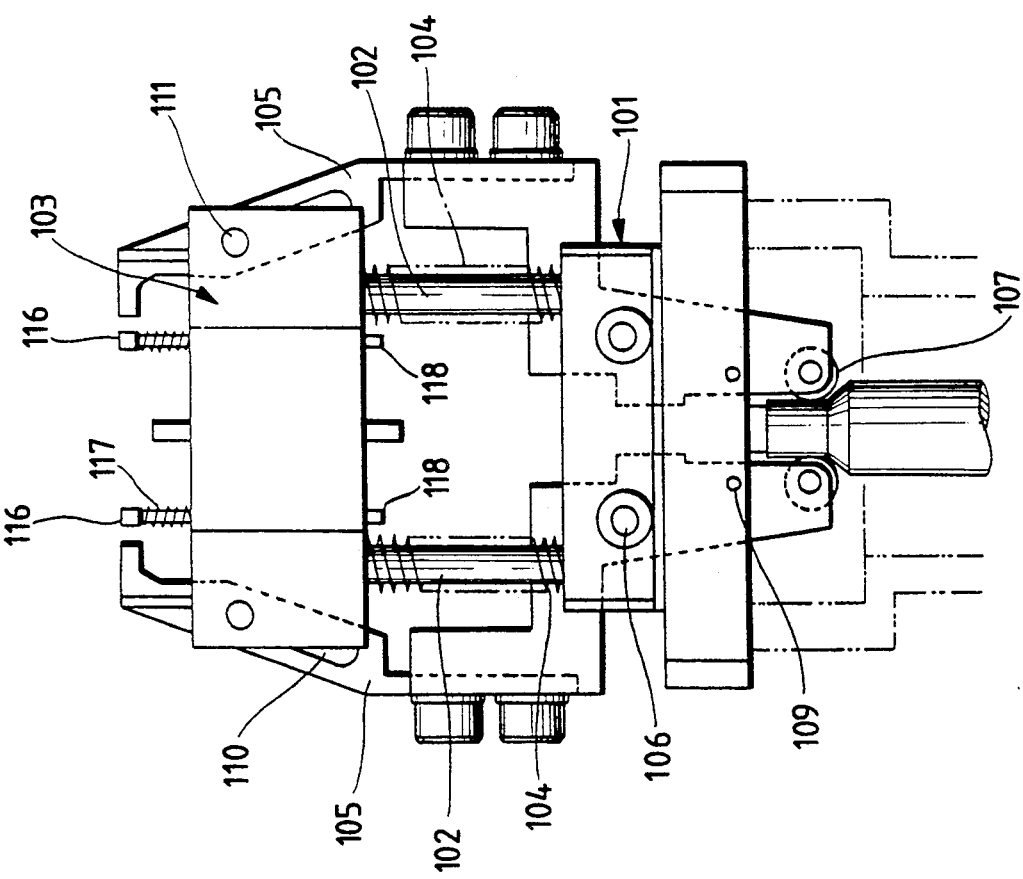

PART INSERTING APPARATUS AND METHOD FOR USE

BACKGROUND OF THE INVENTION

1. Field of the Invention

The present invention relates to a clinch apparatus for causing clinch elements to bend lead wires of electronic parts inserted into a printed circuit board.

2. Background of the Invention

Various types of clinch apparatuses for causing clinch elements to bend lead wires of electronic parts inserted into printed circuit boards have been proposed, as disclosed in Japanese Patent Laid-Open No. 60-32399. According to this publication, chucking of power transistors as electronic parts, their insertion, insertion of nylon fasteners under pressure, clinch detection of lead wires, insertion of nylon fasteners, and detection of insertion of nylon fasteners under pressure can be automatically performed to increase an insertion speed of power transistors in printed circuit boards, thus providing techniques for advantageously improving quality and reliability of products.

In the above publication, however, a control system for the electronic parts inserting apparatus is not illustrated. In general, a detection device for detecting insertion of three lead wires of each power transistor in a printed circuit board is connected to a control unit through a cable, and an insertion confirmation signal is output to the control unit.

Assuming that the detection device and the control unit are connected through a connecting line such as a cable, the connecting wire is moved upon movement of a clinch apparatus. When the clinch apparatus is rotated, the connecting wire is wound around the clinch apparatus unless a specific countermeasure is provided. In the worst case, wire disconnection may occur. Therefore, a strong demand has arisen for eliminating the above drawback.

If the clinch apparatus includes a plurality of clinch mechanisms in accordance with types of electronic parts to be clinched, the number of connections corresponds to the number of clinch mechanisms to increase the manufacturing cost. In addition, electric disconnection tends to occur, thus degrading system reliability.

An apparatus for clinching lead wires of electronic parts upon insertion of the lead wires into through holes formed in a printed circuit board is disclosed in Japanese Utility Model Laid-Open No. 62-158864.

In addition, in an element inserting apparatus for mounting electric elements in a printed circuit board, a technique for testing electric elements prior to their mounting on the printed circuit board and for caulking element pins after the inserted or mounted elements are optimal elements is disclosed in U.S. Pat. No. 4,212,075 (Japanese Patent Publication No. 63-29840).

SUMMARY OF THE INVENTION

It is the first object of the present invention to provide a head apparatus for holding parts having lead wires to be inserted into through holes formed in a printed circuit board, e.g., for holding electric and electronic parts such as ICs (integrated circuits), capacitors, resistors, and transistors, on the printed circuit board, and then inserting the lead wires into the through holes.

According to the present invention as far as the head apparatus is concerned, there is provided a head apparatus having a plurality of head means corresponding to types of electronic parts in accordance with sizes, shapes, the number of lead wires of electronic parts, each of the plurality of head means being provided with gripper members having a gripping function of gripping an electronic part and an opening means having a function of releasing gripping of the part upon opening of the gripper members, and the plurality of head means being driven and controlled by a single driving means.

It is the second object of the present invention to provide a clinch apparatus having a function of bending lead wires inserted into the through holes in the printed circuit board. In particular, the clinch apparatus according to the present invention checks whether the lead wires are inserted into the through holes of the printed circuit board and inhibits a clinch means to perform clinching when any lead wire which is not inserted into the corresponding through hole in the printed circuit board is present.

There is also provided a clinch apparatus which performs clinching (bending of the lead wires) when the lead wires are satisfactorily inserted into the through holes on the basis of the checking result.

There are further provided a parts inserting apparatus in the clinch apparatus, comprising a clinch means for bending lead wires, a means for checking insert states of the lead wires, and a means for retracting the checking means for checking the insert states prior to a clinch operation of the clinch means, and a method therefor.

It is the third object of the present invention to provide a clinch apparatus for connecting a detecting means for detecting insert states of lead wires of electronic parts and a control means in a noncontact manner so as to eliminate direct connections, thereby eliminating wire connections.

In the parts inserting apparatus which achieves the third object of the present invention, there is provided an apparatus for converting a signal from the detecting means into a light signal and providing the light signal as a control signal for the driving means for driving the clinch means, thereby achieving control in the noncontact manner.

In the control apparatus described above, a plurality of clinch apparatuses each consisting of the detecting means, the means for retracting the detecting means, and the clinch means are provided on a rotary member to prepare clinch apparatuses corresponding to types of electronic parts, thereby allowing mounting of parts of different types having different shapes on the printed circuit board. There is also provided an apparatus for preventing entangling of signal lines (wires) of a control system upon intermittent rotation of the rotary member.

It is the fourth object of the present invention to provide an apparatus capable of handing electronic parts of different types having different shapes so as to perform insertion, checking, and clinching of these electronic parts.

In particular, a plurality of head apparatuses corresponding to the electronic parts of different types having different shapes are arranged with respect to the rotary member, and each head apparatus is moved to an insert or pickup position upon rotation of the rotary member.

There is also provided an apparatus for improving parts mounting efficiency per unit time by comparing a rotation amount of the head apparatus pivoted to the insert position with a rotation amount of the head apparatus pivoted to the pickup position.

It is the fifth object of the present invention to provide a clinch apparatus for inserting lead wires of electronic parts into holes of a printed circuit board and clinching the inserted lead wires, having a function of checking insert states of the lead wires prior to a clinch operation and a function of assuring proper check even if variations are present during checking, and more specifically, even if variations are present in lengths of the lead wires of the electronic parts.

BRIEF DESCRIPTION OF THE DRAWINGS

FIG. 6 is a cross-sectional view showing the clinch mechanism along the line VI—VI in FIG. 3A;

FIG. 7 is a longitudinal sectional view showing a detection pin mounting state in a detection unit, wherein insertion of connecting pins of an IC is defective;

FIGS. 18A to 21 show the second embodiment of the present invention, in which FIGS. 18A, 18B, and 18C are a front view, a side view, and a plan view, respectively, showing an arrangement of an inserting/checking apparatus for an electronic part according to the present invention, FIG. 20 is a block diagram showing a current path during insertion/checking according to the present invention; and FIG. 21 is a sectional view for explaining a clinch operation.

DETAILED DESCRIPTION OF THE PREFERRED EMBODIMENTS

A mounting system to which an arrangement of the first embodiment of a clinch apparatus according to the present invention is applied will be described in detail with reference to FIGS. 1 to 17.

Figure 1:
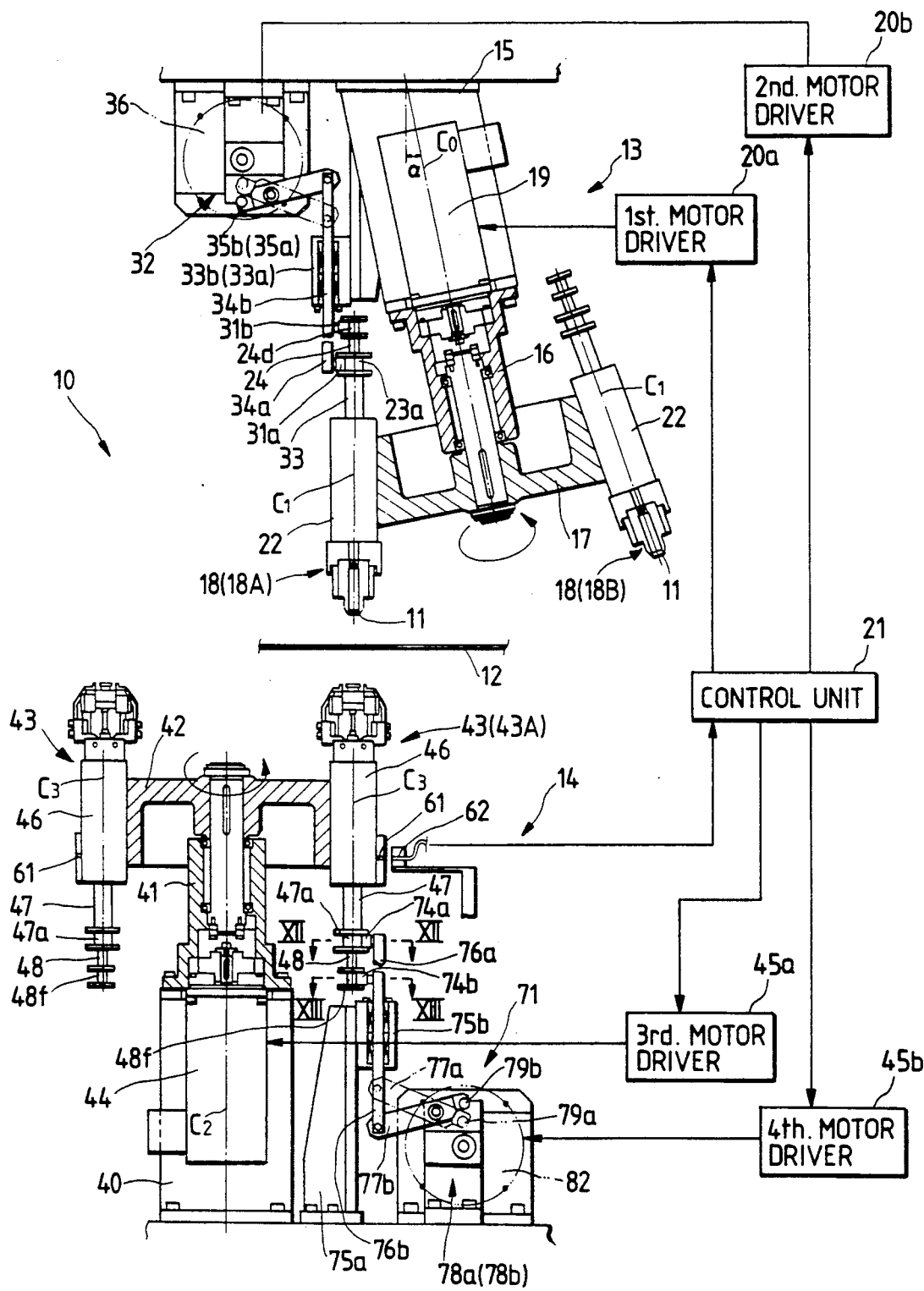
FIG. 1 is a front view showing a structure of a mounting system to which a clinch apparatus according to the present invention is applied.

According to this embodiment, as shown in FIG. 1, a mounting system 10 mainly comprises a head apparatus 13 for picking up electronic parts 11 from a parts feeding unit (not shown) at a pickup position and inserting or mounting them on a printed circuit board 12, and a clinch apparatus 14 as a characteristic feature of the present invention to clinch the inserted electronic parts 11 on the printed circuit board 12.

The electronic parts 11 are package type ICs. Each IC 11 comprises a package body 11a in which an IC chip is incorporated and a large number of lead wires 11b mounted to be bend downward from both sides of the package body 11a. Four lead wires $11b_1$, $11b_2$, $11b_3$, and $11b_4$ located at four corners of the chip are bent by the clinch apparatus 14 and are defined as lead wires to be clinched to the printed circuit board 12.

The structure of the head apparatus 13 will be briefly described, and then a detailed description of the clinch apparatus 14 as the characteristic feature of the present invention will be made.

A) Description of Head Apparatus

As shown in FIG. 1, the head apparatus 13 comprises a first rotary support member 16 mounted through a first mounting stay 15 on a base (not shown) located above the printed circuit board 12 to which the ICs 11 are to be mounted, a first rotary table 17 supported on the first rotary support member 16 to be rotatable about an axis $C_0$ of rotation inclined from the vertical axis by an angle α, a plurality (ten in this embodiment) of bases, i.e., head mechanisms $18_1$ to $18_{10}$ (numbers are assigned to these head mechanisms from one to ten in the counterclockwise direction) mounted on the edge of the first rotary table 17 at equal angular intervals, and a first drive motor 19 for intermittently driving the first rotary table 17 in one rotational direction, e.g., the counterclockwise direction in units of 36°.

The head mechanisms $18_1$ to $18_{10}$ have the same structure. In the following description, identical parts are designated by reference numeral 18 without suffixing the corresponding numbers. The reference numerals suffixed with the corresponding numbers (i.e., $18_1$ to $18_{10}$) are used only when the head mechanisms are to be independently explained.

The first drive motor 19 of each head mechanism is controlled to be driven by a control unit 21 through a first motor driver 20a. When each head mechanism 18 located at a pickup or insert position (i.e., an upstream side in the rotational direction, or a clockwise direction) next to a given head mechanism does not perform a pickup or insert operation, the control unit 21 skips the next stop position and continuously rotates the head mechanisms until the head mechanism 18 which is supposed to perform the pickup or insert operation reaches the pickup or insert position.

The ICs 11 consist of 20 parts which are classified into ten shapes. IC gripper portions of the head devices $18_1$ to $18_{10}$ are designed to grip ICs $11_1$ to $11_{10}$ corresponding to the ten shapes. For example, the IC gripper portion of the first head mechanism $18_1$ is designed to grip only the IC $11_1$ having the first shape. Note that the IC gripper portions of the respective head mechanisms 18 are arbitrarily detachable from the first rotary table 17.

A central axis $C_1$ of each head mechanism 18 is set to be inclined from the axis $C_0$ of rotation of the head apparatus 13 by the angle $\alpha$, as shown in FIG. 1. The central axis $C_1$ of the head mechanism (represented by reference numeral 18A) located at the insert position is parallel to the vertical axis. The head mechanism (represented by reference numeral 18B) located at a position opposite (180°) to the head mechanism 18A located at the insert position is inclined from the vertical axis by an angle $2\alpha$, and the head mechanism 18B is located at the pickup position of a parts feeder unit (not shown).

Figure 2:
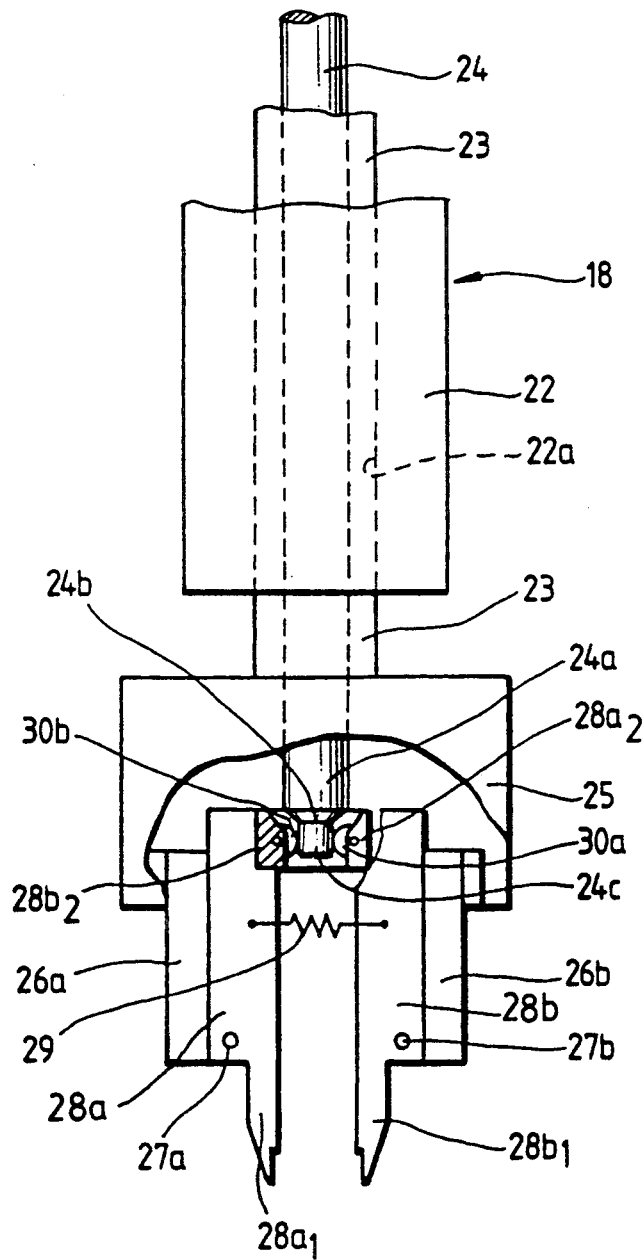
FIG. 2 is a partially cutaway front view showing an arrangement of a head or head mechanism in a head apparatus included in the mounting system shown in FIG. 1.

As shown in FIG. 2, each head mechanism 18 comprises a first mounting body 22 fixed at a corresponding side surface portion of the first rotary table 17. The first mounting body 22 has a through hole 22a along its central axis. A first thick shaft 23 having a hollow cylindrical shape is inserted into the through hole 22a to be movable along its axial direction. A first solid thin shaft 24 is inserted into the first thick shaft 23 to be movable along its axial direction.

A head body 25 having an open lower end and a hollow cylindrical shape is detachably mounted on the lower surface of the first thick shaft 23. The lower end of the first thin shaft 24 extends downward through the upper surface of the head body 25. The first thin shaft 24 comprises a large-diameter portion 24a inserted into the first thick shaft 23, a tapered portion 24b connected to the lower end of the large-diameter portion 24a and having a tapered surface so as to reduce its diameter downward, and a small-diameter portion 24c connected to the lower end of the tapered portion 24b and having a diameter smaller than the large-diameter portion 24a.

A pair of mounting pieces 26a and 26b spaced apart from each other in the back-and-forth direction extend downward from both sides of the lower portion of the head body 25. Horizontal support shafts 27a and 27b are mounted at lower end portions of the pair of mounting pieces 26a and 26b. Gripper pieces 28a and 28b are respectively supported on the support shafts 27a and 27b so that the intermediate portions of the gripper pieces 28a and 28b are pivotal within the same vertical plane.

The lower end portions of the gripper pieces 28a and 28b are defined as gripper elements $28a_1$ and $28b_1$ for gripping the IC 11 from its both sides. Bent portions $28a_2$ and $28b_2$ are formed at the upper end portions of the gripper elements. The bent portions $28a_2$ and $28b_2$ are bent to oppose each other and extend up to the upper portions of the opposite gripper pieces 28b and 28a through the outer surface of the lower portion of the first thin shaft 24. A coil spring 29 is mounted between the gripper pieces 28a and 28b to bias them in a direction to separate them. Rollers 30a and 30b are mounted at the distal ends of the bent portions $28a_2$ and $28b_2$ and are brought into rolling contact with the outer surface of the first thin shaft 24 from opposite sides so as to pivot about their own axes.

In a state wherein the IC 11 is gripped in a pickup or insert operation (to be described later), the small-diameter portion 24c of the first thin shaft 24 extends downward from the head body 24 while being clamped between the rollers 30a and 30b. In a state wherein the IC 11 is to be released, the large-diameter portion 24a of the first thin shaft 24 extends downward from the head body 25 while being clamped between the rollers 30a and 30b.

In the state wherein the small-diameter portion 24c of the first thin shaft 24 is clamped between the rollers 30a and 30b by a biasing force of the coil spring 29, the gripper elements $28a_1$ and $28b_1$ come close but are spaced apart from each other by an appropriate distance enough to grip the corresponding IC 11 from its both sides. On the other hand, in the state wherein the first thin shaft 24 further extends downward so that the large-diameter portion 24a is clamped between the rollers 30a and 30b, the gripper pieces 28a and 28b are set so that the gripper elements $28a_1$ and $28b_1$ are separated from both the sides of the IC 11 against the biasing force of the coil spring 29, thereby canceling the gripped state.

In this embodiment, in each head mechanism 18, a portion under the head body 25 has a shape (size) conforming the shape (size) of the corresponding IC 11. When the head body 25 is removed from the lower end of the first thin shaft 23, the gripper portion can be interchanged with respect to the first thick shaft 23 so as to cope with an IC having another shape.

Referring back to FIG. 1, a driven portion 23a to be engaged with a thin shaft drive roller 31a (to be described later) is arranged at the upper end of the first thin shaft 23 to move the thick shaft 23 downward. The upper end of the first thin shaft 24 is terminated above the upper end of the first thick shaft 23. A driven portion 24d to be engaged with a thin shaft drive roller 31b (to be described later) is formed at the upper end of the first thin shaft 23 so as to move it downward.

An insert device 32 for performing an insert operation is arranged adjacent to only the head mechanism 18A pivoted to the insert position. The insert device 32 comprises the thick shaft drive roller 31a and the thin shaft drive rollers 31b which are respectively engaged with the driven portions 23a and 24a formed on the thick and thin shafts 23 and 24 of the head mechanism 18A located in the insert position, and connecting rods 34a and 34b which are supported to be vertically movable through support members 33a and 33b and the lower ends of which are connected to the thick and thin shaft drive rollers 31a and 31b, respectively.

Drive cam mechanisms 35a and 35b are connected to the connecting rods 34a and 34b, respectively. The drive cam mechanisms 35a and 35b have the following function. Upon one revolution (i.e., 360°) of cam members (not shown), the gripper portion of the head mechanism 18A is moved downward while the IC 11 is gripped by the cam mechanisms 35a and 35b through the connecting rods 34a and 34b (without changing a relative distance between the connecting rods 34a and 34b). After the IC 11 is inserted into the printed circuit board 12, the cam mechanisms 35a and 35b are driven so that only the first thin shaft 24 is moved downward to release the IC 11. The head mechanism 18A is then slightly moved upward, and only the first thin shaft 24 is moved upward to restore a gripped state. The head mechanism 18A is entirely moved upward to the upper standby position.

The drive cam mechanisms 35a and 35b are driven by a common insertion second drive motor 36 in a synchronous manner. The second drive motor 36 comprises a reversible motor. Upon normal rotation of the motor 36 in the counterclockwise direction, the insert operation is performed. However, upon reverse rotation of the motor 36 in the clockwise direction, a reverse operation can be performed. The second drive motor 36 is controlled and driven by the control unit 21 through a second motor driver 20b. The control unit 21 is arranged so that one insertion cycle is completed upon simultaneous driving of the drive cam mechanisms 35a and 35b by one revolution (this operation will be described in detail later).

Since the head apparatus 13 is constructed as described above, the head mechanism 18A rotated to the insert position can insert the IC 11 into through holes formed in the printed circuit board 12 by the insert device 32.

B) Description of Clinch Apparatus

The structure of the clinch apparatus 14 as a characteristic feature of the present invention will be described in detail with reference to FIGS. 1 and 3 to 15E.

As shown in FIG. 1, the clinch apparatus 14 comprises a second rotary support member 41 mounted through a second mounting stay 40 to a second base (not shown) located below the printed circuit board 12 to which the ICs 11 are mounted, a second rotary table 42 supported on the second rotary support member 41 to be rotatable about an axis $C_2$ of rotation extending along the vertical axis, a plurality (ten in this embodiment) of clinch mechanisms $43_1$ to $43_{10}$ (numbers are assigned to the devices from one to ten along the clockwise direction opposite to that in the head mechanisms 18) mounted at the edge of the second rotary table 42 at equal angular intervals, and a third drive motor 44 for intermittently driving the second rotary table 42 in one direction, i.e., the counterclockwise direction in synchronism with the first drive motor 19 in units of 36°.

The clinch mechanisms $43_1$ to $43_{10}$ have the same structure. In the following description, identical parts are designated by reference numeral 43 without suffixing the corresponding numbers. The reference numerals suffixed with the corresponding numbers (i.e., $43_1$ to $43_{10}$) are used only when the clinch mechanisms are to be independently explained. The first to tenth clinch mechanisms $43_1$ to $43_{10}$ correspond to the first to tenth head mechanisms $18_1$ to $18_{10}$ described above, respectively, and are designed to clinch the first to tenth ICs $11_1$ to $11_{10}$, respectively. A clinch mechanism located at a clinch position is represented by reference numeral 43A.

The third drive motor 44 is controlled to be driven by the control unit 21 through a third motor driver 45a. The control unit 21 controls to drive the third drive motor 44 through the third motor driver 45a so that the corresponding clinch mechanism 43 is always located at a clinch position defined as a position vertically aligned with the insert position.

C) Description of Clinch Device 43

The structure of each clinch mechanism 43 will be described with reference to FIGS. 3A to 15E.

Figure 3A:
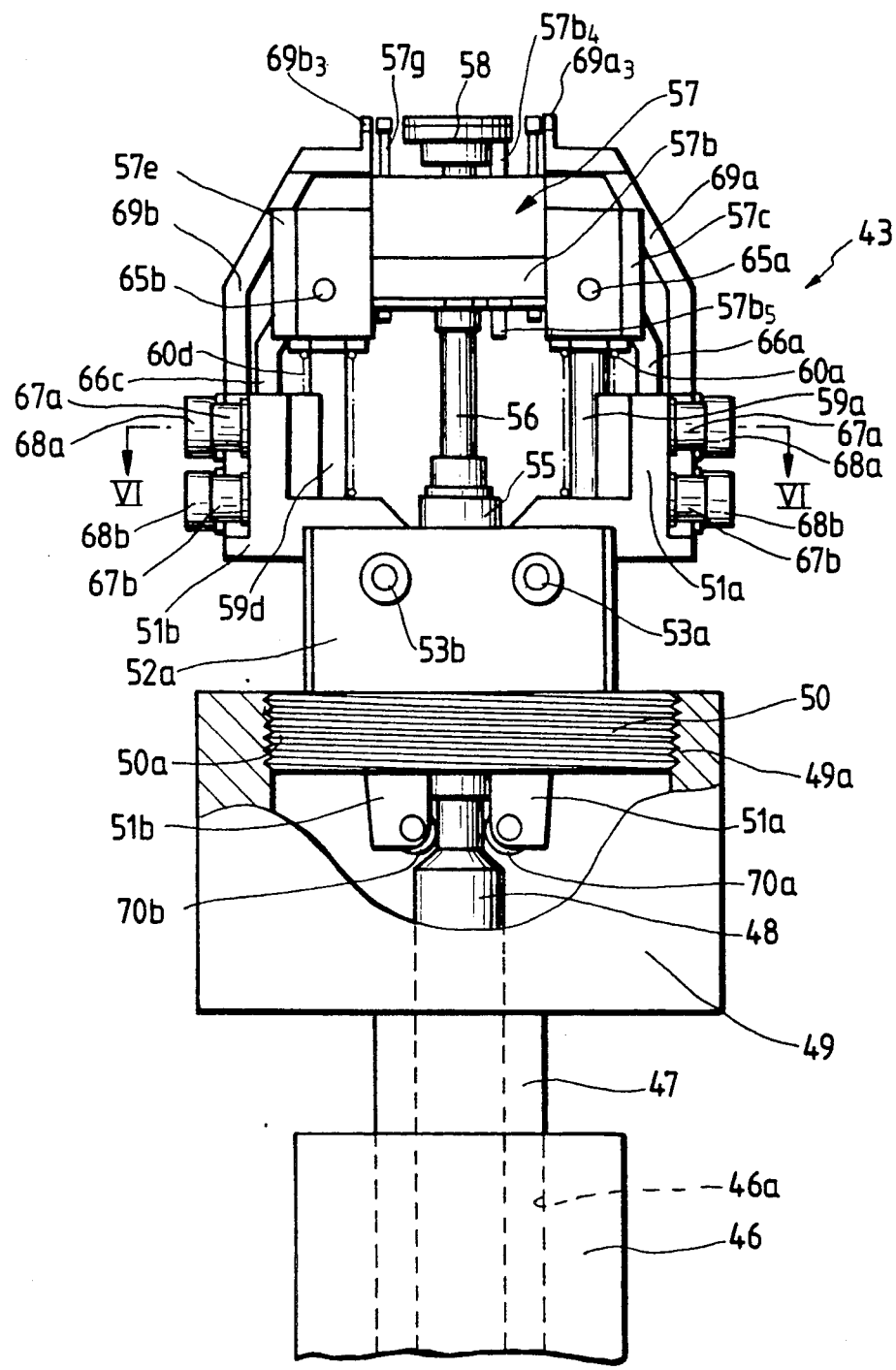
FIGS. 3A to 3C are a front view, a plan view, and a side view, respectively, of the clinch mechanism.

The clinch mechanism 43 comprises a second mounting body 46 fixed to a corresponding side surface portion of the second rotary table 42. As shown in FIG. 3A, a through hole 46a is formed in the second mounting body 46 along an axis $C_3$ of movement set along the vertical axis. A second thick shaft 47 having a hollow cylindrical shape is inserted into the through hole 46a to be movable along the axis $C_3$. A solid second thin shaft 48 is inserted into the second thick shaft 47 to be movable along the axis $C_3$.

As shown in FIG. 3A, a clinch body 49 having upper and lower open ends and a hollow cylindrical shape is fixed to the upper portion of the second thick shaft 47. An internal thread portion 49a is formed on the inner circumferential surface of the upper open end of the clinch body 49. An annular base 50 is detachably mounted on the upper open end of the clinch body 49. More specifically, the detachable base 50 has an external thread portion 50a on its circumferential surface. The external thread portion 50a is threadably engaged with the internal thread portion 49a of the clinch body 49. A through hole 50b (FIG. 5) is formed at the central portion of the base 50 so as to loosely receive the upper end of the second thin shaft 48 and the lower ends of a pair of press member mounting members 51a and 51b.

Figure 5:
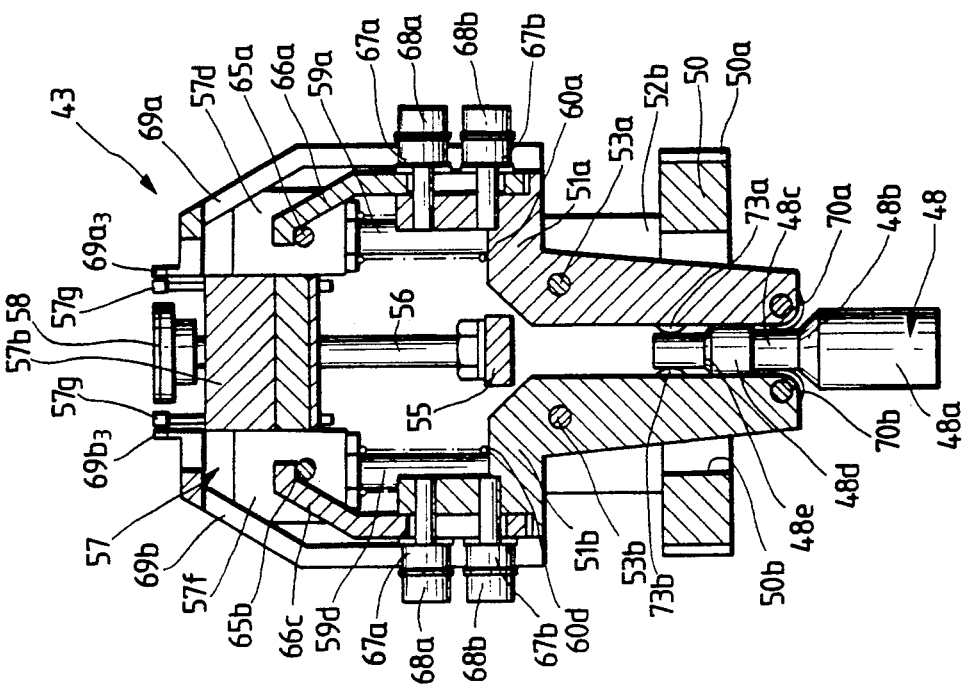
FIG. 5 is a longitudinal sectional view showing the clinch mechanism along the line V—V in FIG. 3C.
Figure 4:
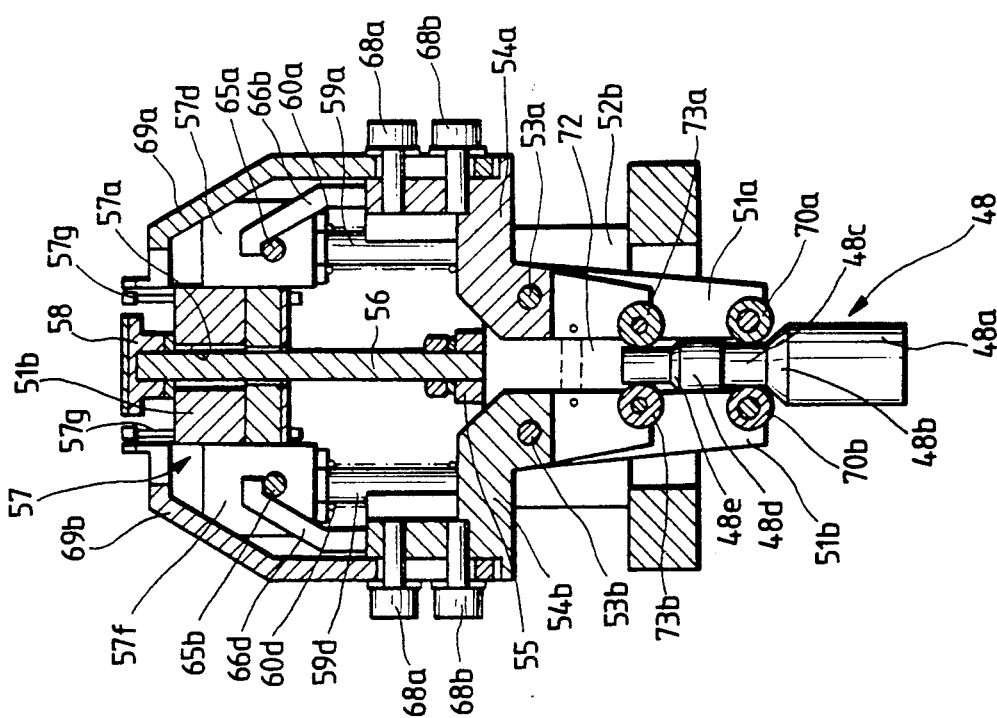
FIG. 4 is a longitudinal sectional view showing the clinch mechanism along the line IV—IV in FIG. 3C.

The upper end of the second thin shaft 48 extends above the detachable base 50 through the through hole 50b. As shown in FIGS. 4 and 5, the second thin shaft 48 comprises a large-diameter portion 48a inserted into the second thick shaft 47, a first tapered portion 48b connected to the upper end of the large-diameter portion 48a and having a first tapered surface whose diameter is reduced upward, a first small-diameter portion 48c connected to the upper end of the first tapered portion 48b having a diameter smaller than the large-diameter portion 48a, a second small-diameter portion 48d formed at the intermediate portion of the first small-diameter portion 48c and having a diameter larger than that of the first small-diameter portion 48c and smaller than that of the large-diameter portion 48a, and a second tapered portion 48e formed at the upper end of the second small-diameter portion 48d and having a second tapered surface having the same tapered state as in the first tapered surface described above.

A pair of support blocks 52a and 52b are integrally formed on the upper surface of the detachable base 50 so as to interpose the through hole 50b formed in the base 50. A pair of parallel rotary shafts 53a and 53b are bridged in the support blocks 52a and 52b at the same level.

The intermediate portions of the press member mounting members 51a and 51b are pivotally supported on the rotary shafts 53a and 53b, and the intermediate portions of clinch member mounting members 54a and 54b (to be described later) are pivotally supported on these rotary shafts 53a and 53b, respectively. In this embodiment, the rotary shafts 53a and 53b serve as common support shafts for the press member mounting members 51a and 51b and the clinch member mounting members 54a and 54b.

As shown in FIG. 6, a connecting member 55 is bridged on the pair of support blocks 52a and 52b along a horizontal central line. A first guide rod 56 is fixed upright at the center of the connecting member 55 along the vertical axis, i.e., the axis $C_3$ of movement. The upper portion of the first guide rod 56 is extracted above through a through hole 57a (FIG. 4) vertically extending at the center of a detection unit 57 (to be described later). The upper end of the first guide rod 56 is integrally mounted with a circular support member 58 which supports the lower surface of a portion of the printed circuit board 12 at a position where the IC 11 is inserted from the upper surface of the printed circuit board 12.

D) Description of Detection Unit

Figure 3B:
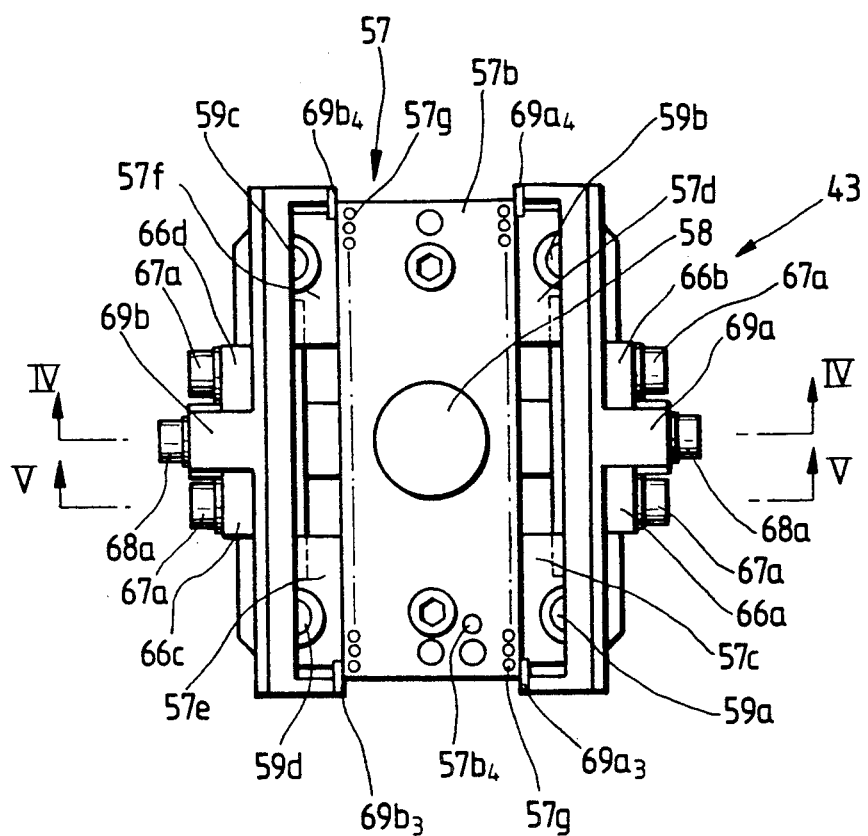

The detection unit 57 is vertically guided and supported through four second guide rods 59a to 59d (to be described later). The detection unit 57 comprises a central detection body 57b guided by the first guide rod 56 and having almost a rectangular parallelepiped shape, and guide blocks 57c and 57d and guide blocks 57e and 57f integrally connected to side portions near both ends (i.e., four corner portions) of the detection body 57b, as shown in FIG. 3B.

The second guide rods 59a to 59d are fixed at ends of the pair of support blocks 52a and 52b while standing upright. The upper ends of the second guide rods 59a to 59d extend via through holes (not shown) formed in the guide blocks 57c to 57f, respectively. As described above, the detection unit 57 is vertically movably supported and guided by the four second guide rods 59a to 59d.

Coil springs 60a to 60d are mounted between the guide blocks 57c to 57f corresponding to the second guide rods 59a and 59b and the support blocks 52a and 52b. The detection unit 57 as a whole is always biased upward by the coil springs 60a to 60d. As shown in FIG. 4, press members 66a and 66b and press members 66c and 66d (to be described later) abut against the lower ends of locking rods 65a and 65b, so that the upper ends of the press members 66a, 66b, 66c, and 66d are regulated.

Figure 8:
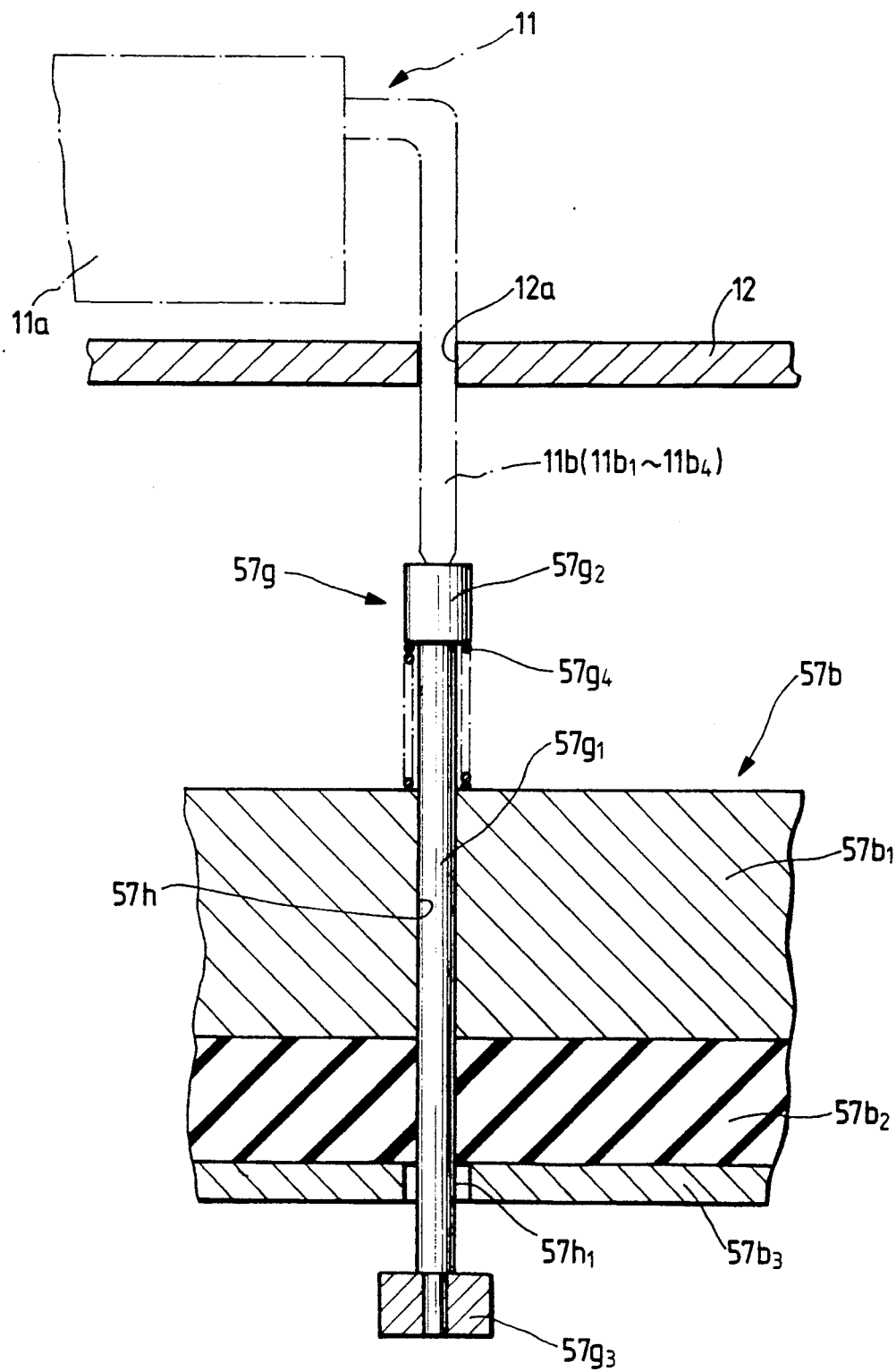
FIG. 8 is a longitudinal sectional view showing a detection pin mounting state in the detection unit, wherein insertion of the connecting pins of the IC is proper.

As shown in FIGS. 7 and 8, the detection body 57b has a horizontal three-layered structure which comprises a first electro-conductive block $57b_1$ as an upper layer, an insulating block $57b_2$ as an intermediate layer, and a second electro-conductive block $57b_3$ as a lower layer. As a result, the first and second electro-conductive blocks $57b_1$ and $57b_3$ are electrically insulated from each other through the insulating block $57b_2$.

The detection unit 57 has a plurality of detection pins 57g constituting two lateral rows so as to correspond to all the lead wires 11b. These detection pins 57g are located just below the lead wires 11b of the IC 11 inserted into the printed circuit board 12. As shown in FIG. 7, these detection pins 57g extend through holes 57h vertically extending through the detection body 57b. The detection pins 57g are vertically movably supported through the through holes 57h, respectively.

As shown in FIG. 7, each detection pin 57g comprises a pin body $57g_1$ extending through the through hole 57h, and head and bottom portions $57g_2$ and $57g_3$ respectively formed at the upper and lower ends of the pin body $57g_1$ and each having a larger diameter than that of the pin body $57g_1$. The pin body $57g_1$ and the head and bottom portions $57g_2$ and $57g_3$ are integrally formed of the same material. A coil spring $57g_4$ is inserted between the lower end of the head portion $57g_2$ of the pin body $57g_1$ and the upper end of the detection body 57b to bias the detection pin 57g upward.

The through hole $57h_1$ formed in the second electro-conductive block $57b_3$ as the lower layer has a diameter larger than that of the pin body $57g_1$, as shown in FIG. 7. That is, the outer surface of the pin body $57g_1$ of the detection pin 57g is spaced apart from the second electro-conductive block $57b_3$, i.e., is not electrically connected thereto.

As shown in FIG. 7, in a state wherein the detection pin 57g is not pushed down by the corresponding lead wire 11b, although the outer surface of the pin body $57g_1$ of the detection pin 57g is not brought into contact with the second electro-conductive block $57b_3$, the upper surface of the bottom portion $57g_3$ is brought into contact with the lower surface of the second electro-conductive block $57b_3$, so that the first and second electro-conductive blocks $57b_1$ and $57b_3$ are electrically connected (conductive state) through the detection pin 57g.

As shown in FIG. 8, in a state wherein the detection pin 57g is pushed down by the corresponding lead wire 11b, the upper surface of the bottom portion $57g_3$ is separated from the lower surface of the second electro-conductive block $57b_3$. In this state, the first and second electro-conductive blocks $57b_1$ and $57b_3$ are not electrically connected (nonconductive state) due to the presence of the detection pin 57g.

In a state wherein the IC 11 has inserted into the printed circuit board 12, it is electrically checked whether the lead wires 11b of the IC 11 extend through the printed circuit board 12 by conductive or nonconductive states of the first and second electro-conductive blocks $57b_1$ and $57b_3$ of the detection units 57. More specifically, at least one lead wire 11b does not extend through the printed circuit board 12 and does not push down the corresponding detection pin 57g, the state shown in FIG. 7 is obtained. In this case, the first and second electro-conductive blocks $57b_1$ and $57b_3$ are kept in the conductive state.

On the other hand, when all the lead wires 11b satisfactorily extend through the printed circuit board 12 and all the detection pins 57 are pushed down, the state shown in FIG. 8 is obtained. In this case, all the first and second electro-conductive blocks $57a_1$ and $57b_3$ are set in a nonconductive state.

The detection pin 57g of the detection unit 57 serves as a kind of detection switch SW which is turned on/off by the corresponding lead wire 11b. As is apparent from the above description, the detection switch SW is turned on by incomplete insertion of at least one lead wire 11 and is turned off by completion of satisfactory insertion of all the lead wires 11b. Terminals $DS_1$ and $DS_2$ of this detection switch SW are constituted by connecting terminals $57b_4$ (as shown in FIG. 3A) and $57b_5$ extending upright from the surfaces of the first and second electro-conductive blocks $57b_1$ and $57b_3$, respectively, as shown in FIG. 7.

E) Description of Detection Check Device (LED)

Figure 9:
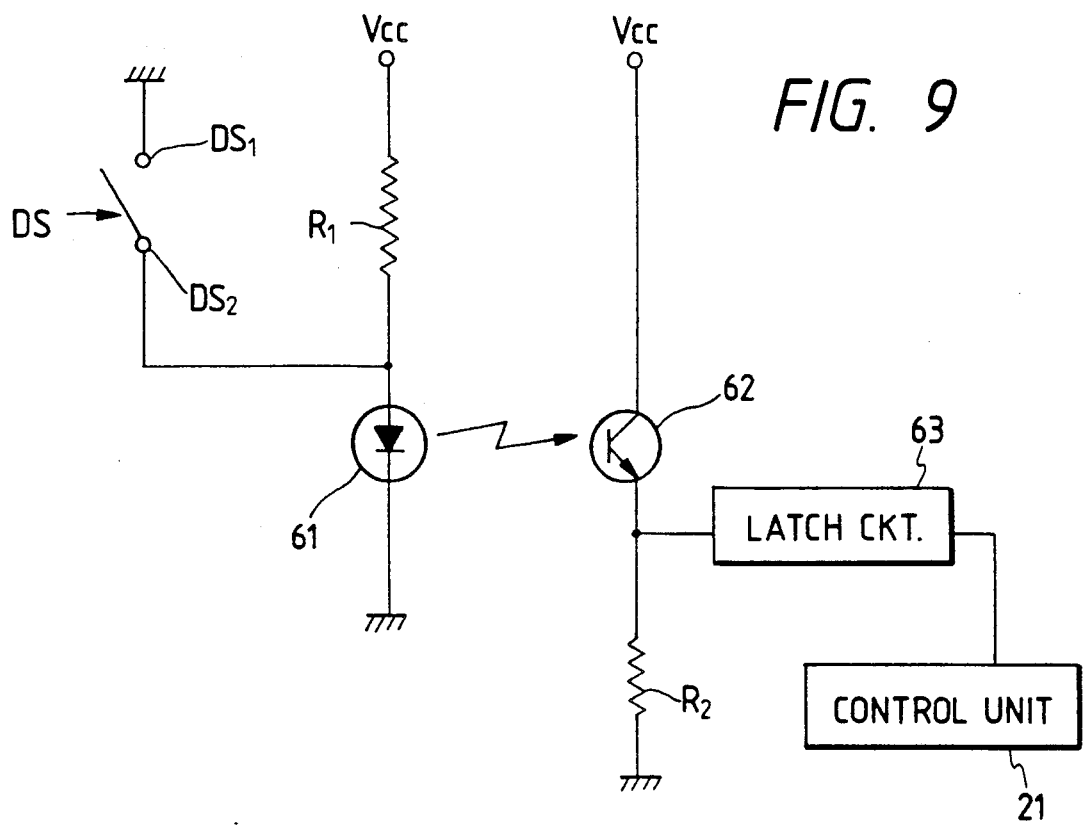
FIG. 9 is a circuit diagram showing electrical connecting states of a detection switch.

Referring back to FIG. 1 again, a light-emitting element such as an LED 61 is exposed on the outer surface of each second mounting body 46. One light-receiving element such as a phototransistor 62 is arranged to oppose only the LED 61 of the clinch mechanism 43 located at the clinch mechanism 43. As shown in FIG. 9, one terminal of the LED 61 is grounded through the detection switch $DS_2$ and is connected to a power source Vcc through a predetermined resistor R1. The other terminal of the LED 61 is grounded. The detection switch $DS_1$ is turned off upon completion of insertion of all the lead wires 11b, and the LED 61 is turned on. However, when at least one lead wire 11b is not satisfactorily inserted, the detection switch SW is turned on to turn off the LED 61.

As shown in FIG. 9, the base of the phototransistor 62 is arranged to oppose the LED 61. The emitter of the phototransistor 62 is connected to the power source Vcc, and the collector of the phototransistor 62 is grounded through a predetermined resistor R2. When the LED 61 emits light, this light is received by the phototransistor 62 which is then turned on. An input voltage to a latch circuit 63 is increased. In the latch circuit 63, when the input voltage exceeds a predetermined threshold value, the input value is latched. This latch signal is sent to the control unit 21 and serves as an enable signal (start signal) for the start of downward movement of the detection unit 57 (this operation will be described later) and for the operation which is performed after the push-in operation is completed.

This latched state can be released by downward movement of the clinch body 49 of the clinch device 43A upon completion of the clinch operation.

In this embodiment, the detection result in the detection unit 57 is transmitted to the control unit 21 through the phototransistor 62 located to oppose the LED 61 in a separated manner. As a result, even if the second rotary table 42 is rotated and the clinch mechanisms $43_1$ to $43_{10}$ are located at the clinch position, any connecting cable is not entangled since the control unit 21 is not directly connected to the detection unit 57 through a connecting cable. The second rotary table 42 can be freely rotated, and wiring can be greatly simplified.

According to this embodiment, since the phototransistor 62 opposes the LED 61 in the clinch mechanism 43A located at the clinch position, the LEDs must be respectively arranged in all the clinch mechanisms 43 of each clinch apparatus 14. However, only one phototransistor 62 is arranged in one clinch apparatus 14. In addition, only one transmission line is required to connect the phototransistor 62 to the control unit 21, thereby achieving low cost.

F) Description of Push-in Device

A structure of a push-in device 64 for performing a push-in operation for pushing down the detection unit 57 so as not to bend the detection pin 57g during the clinch operation after the detection operation is completed but the clinch operation is started will be described below.

Figure 3C:
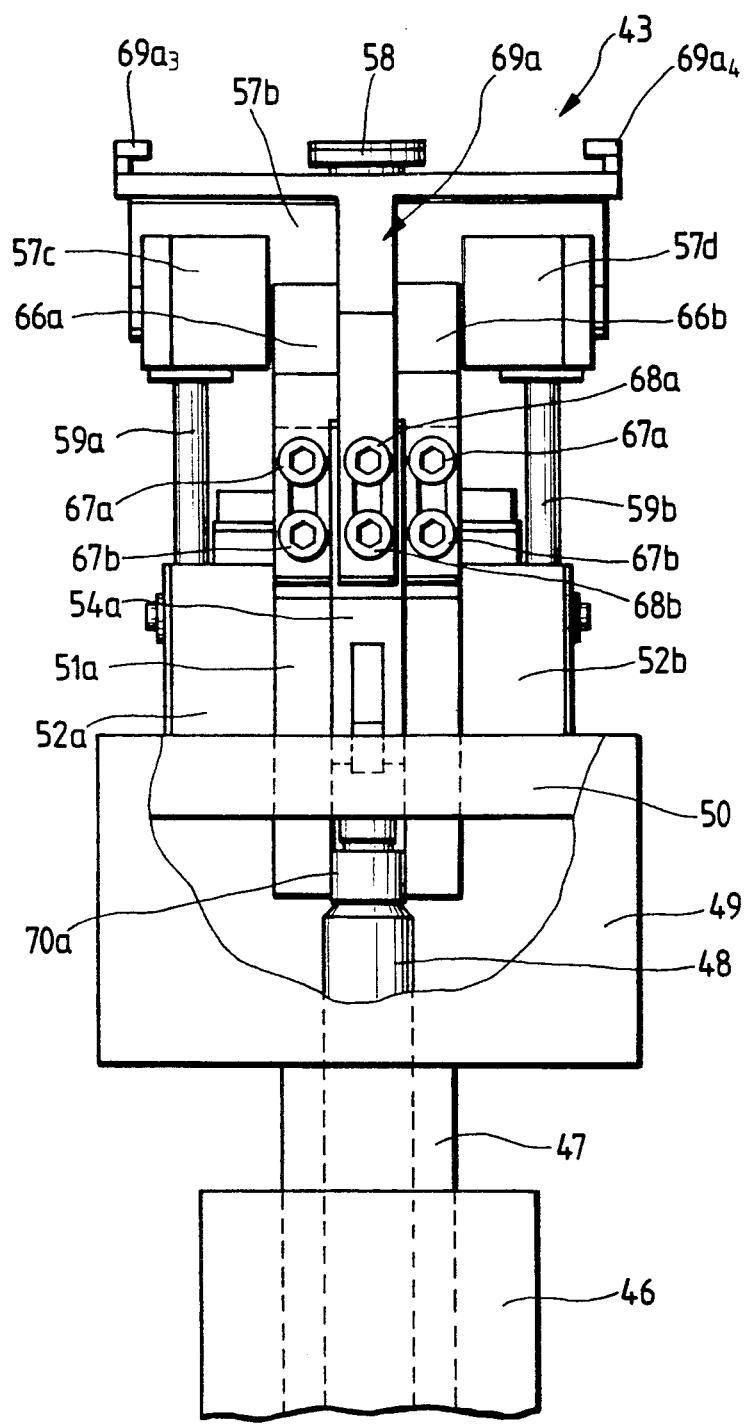

As shown in FIGS. 3A and 4, the push-in device 64 comprises a pair of parallel locking rods 65a and 65b horizontally bridged on the pair of guide blocks 57b and 57c and the pair of guide blocks 57d and 57e. As shown in FIG. 4, the press member mounting members 51a and 51b are formed to have a crank-like shape so as to be bent twice outwardly upward. The mounting members 51a and 51b are rotatably supported at their lower bent portions (the lengths in the vertical direction have been described above; almost intermediate portions) through the pivot shafts 53a and 53b. A pair of press members 66a and 66b and a pair of press members 66c and 66d are fixed to both ends of the press member mounting members 51a and 51b through pairs of upper and lower bolts 67a and 67b, as shown in FIG. 3C.

As is apparent from FIG. 6, gaps are formed between the press members 66a, 66b, 66c, and 66d. Clinch members 69a and 69b fixed to the clinch member mounting members 54a and 54b are fitted in these gaps through pairs of upper and lower bolts 68a and 68b.

As shown in FIG. 5, the press members 66a, 66b, 66c, and 66d are defined by inclined surfaces as inner surfaces engaged with the locking rods 65a and 65b at both sides of the members 66a, 66b, 66c, and 66d. First rollers 70a and 70b in rolling contact with the outer surface of the upper end portion of the second thin shaft 48 are rotatably mounted at the lower ends of the press member mounting members 51a and 51b mounted with the press members 66a and 66b and the press members 66c and 66d. The rolling contact positions of the first rollers 70a and 70b on the second thin shaft 48 are defined as the lower end of the first small-diameter portion 48c, i.e., a portion of the first small-diameter portion 48c at a position located immediately above the first tapered portion 48b when the second thin shaft 48 does not extend from the second thick shaft 47.

As a result, when a clinch device or driver 71 (to be described in detail later) is operated to extend the second thin shaft 48 from the thick shaft 47 by a first extension amount, the rolling contact positions of the first rollers 70a and 70b on the second thin shaft 48 are shifted from the first small-diameter portion 48c to the large-diameter portion 48a through the first tapered portion 48b. The four press members 66a, 66b, 66c, and 66d are pivoted to bend inward about the corresponding pivot shafts 53a and 53b, so that the four guide blocks 57c to 57f (i.e., the detection unit 57 as a whole) are pushed downward with the corresponding locking rods 65a and 65b against the biasing forces of the coil springs 60a to 60d.

The detection pins 57g are also moved downward upon downward movement of the detection unit 57, so that the push-in state effected by the lead wires 11b of the IC 11 inserted into the printed circuit board 12 can be relatively released. The detection switch SW is turned off. In this case, since a detection voltage (i.e., the input voltage increased upon light emission of the LED 61) of the phototransistor 62 is latched by the latch circuit 63, no problems are posed in the subsequent control operations.

Upon downward movement of the detection unit 57, the detection pins 57g are also moved downward. Even if clinch elements $69a_3$ and $69a_4$ of the clinch member 69a and clinch elements $69b_3$ and $69b_4$ of the clinch member 69b are pivoted inward in a clinch operation (to be described later), the clinch elements $69a_3$, $69a_4$, $69b_3$, and $69b_4$ are engaged with the detection pins 57g to prevent the detection pins 57g from being bent inward.

In this embodiment, prior to the clinch operation, since the detection unit 57 is pushed down by the push-in device 64 so that the clinch elements $69a_3$, $69a_4$, $69b_3$, and $69b_4$ are moved downward to positions where they are not engaged with the detection pins 57g, the detection operation of the detection unit 57 is always stably performed, thus improving system reliability.

As shown in FIG. 4, the clinch members 69a and 69b are respectively attached to the clinch member mounting members 54a and 54b and comprise body portions $69a_1$ and $69b_1$ whose upper ends extend immediately below the side portions of the support member 58. The central portions of horizontal portions $69a_2$ and $69b_2$, both ends of which are terminated horizontally along the side edges of the IC 11 outside the lead wires $11b_1$, $11b_2$, $11b_3$, and $11b_4$ to be clinched, are connected to the upper ends of the body portions $69a_1$ and $69b_1$, respectively, as shown in FIG. 3C. The clinch elements $69a_3$ and $69a_4$ and the clinch elements $69b_3$ and $69b_4$ engaged to the outer sides of the corresponding lead wires $11b_1$, $11b_2$, $11b_3$, and $11b_4$ are formed at both ends of the horizontal portions $69a_2$ and $69b_2$, as shown in FIG. 3B.

The clinch member mounting members 54a and 54b respectively mounted with the clinch members 69a and 69b having the above arrangement are formed to have a crank-like shape as in the press member mounting members 51a and 51b. The lower ends of the mounting members 54a and 54b are terminated above the lower ends of the press member mounting members 51a and 51b, respectively. A coil spring 72 is mounted between the lower portions of the press member mounting members 51a and 51b to bias the lower portions to come close to each other. Second rollers 73a and 73b are pivotally mounted at the lower ends of the clinch member mounting members 54a and 54b so as to be brought into rolling contact with the upper end of the second thin shaft 48 from both sides.

The rolling contact positions of the second rollers 73a and 73b on the thin shaft 48 are defined as the upper end of the first small-diameter portion 48c, i.e., a portion of the first small-diameter portion 48c at a position above the second tapered portion 48e by a predetermined distance when the second thin shaft 48 does not extend from the second thick shaft 47. This predetermined distance is set to be a value enough to cause the rolling contact positions of the second roller 73a and 73b on the second thin shaft 48 to shift from the upper end of the first small-diameter portion 48c to a portion immediately above the second tapered portion 48e upon movement corresponding to the first extension amount of the second thin shaft 48.

When the clinch device 71 (to be described in detail later) is operated to extend the second thin shaft 48 from the second thick shaft 47 by further a second extension amount from the first extension amount, the rolling contact positions of the second rollers 73a and 73b on the second thin shaft 48 are shifted from the first small-diameter portion 48c to the second small-diameter portion 48d through the second tapered portion 48e. The two clinch members 69a and 69b are pivoted inward about the corresponding pivot shafts 53a and 53b against the biasing force of the coil spring 72. The four lead wires $11b_1$, $11b_2$, $11b_3$, and $11b_4$ located at the four corners are bent inward (i.e., clinched) through the corresponding clinch elements $69a_3$, $69a_4$, $69b_3$, and $69b_4$.

Figure 10:
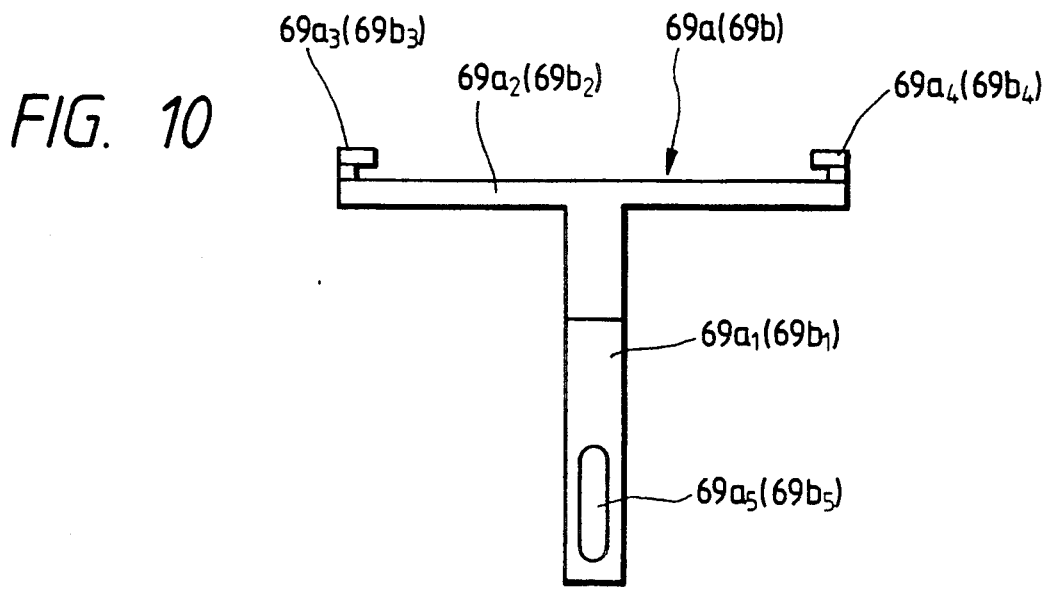
FIG. 10 is a front view showing a structure of clinch members.

In the clinch member 69a or 69b, as shown in FIG. 10, an elongated hole $69a_5$ or $69b_5$ which receives the corresponding one of the pair of upper and lower bolts 68a and 68b is formed at the lower portion of the body portion $69a_1$ or $69b_1$ along the longitudinal direction. With this arrangement, when the pair of bolts 68a and 68b are loosened, the clinch members 69a and 69b can be vertically moved from the corresponding clinch member mounting members 54a and 54b, respectively, so that the vertical positions of the clinch elements $69a_3$, $69a_4$, $69b_3$, and $69b_4$ can be accurately adjusted and defined.

G) Description of Clinch Device

A structure of the clinch device or driver 71 will be described in detail with reference to FIGS. 1 and 11 to 13.

As shown in FIG. 1, a driven portion 47a engaged with a thick shaft drive roller 74a is formed at the lower end of the second thick shaft 47 to move the thick shaft 47 upward. The lower end of the second thin shaft 48 is terminated below the lower end of the second thick shaft 47. A driven portion 48f engaged with a thin shaft drive roller 74b is formed at the lower end of the second thin shaft 48 to move the second thin shaft 48 upward.

The clinch device 71 is arranged adjacent to the clinch mechanism 43A stopped at the clinch position so as to allow a clinch operation of the clinch mechanism 43A pivoted to the clinch position. The clinch device 71 comprises thick and thin shaft drive rollers 74a and 74b respectively engaged with the driven portions 47a and 48f formed on the second thick and thin shafts 47 and 48 of the clinch mechanism 43A located at the clinch position, and connecting rods 76a and 76b respectively connected to the upper ends of the thick and thin shaft drive rollers 74a and 74b and vertically movably supported through the support members 75a and 75b.

One end of each of swinging levers 77a and 77b pivoted about their intermediate portions is pivotally connected to a corresponding one of the lower ends of the two connecting rods 76a and 76b. The other end of each of the swinging levers 77a and 77b is connected to a corresponding one of drive cam mechanisms 78a and 78b. These drive cam mechanisms 78a and 78b cooperate to vertically move the clinch mechanism 43 and performs a clinch operation after the detection unit 57 is moved downward.

Each of cam followers 79a and 79b is connected to the other end of the corresponding one of the swinging levers 77a and 77b. The drive cam mechanisms 78a and 78b comprise cam members 81a and 81b having a single annular groove constituted by cam grooves 80a and 80b engaged with the cam followers 79a and 79b. The cam members 81a and 81b are connected to each other so that they are pivoted together by a common clinch fourth drive motor 82 in a counterclockwise direction (normal direction) in a synchronous manner.

The fourth motor 82 comprises a reversible motor. The fourth motor 82 is controlled to be driven by the control unit 21 through a fourth motor driver 45b. The control unit 21 (to be described in detail later) is arranged to complete one clinch cycle upon simultaneous rotation of the cam members 81a and 81b by one revolution.

Figure 11:
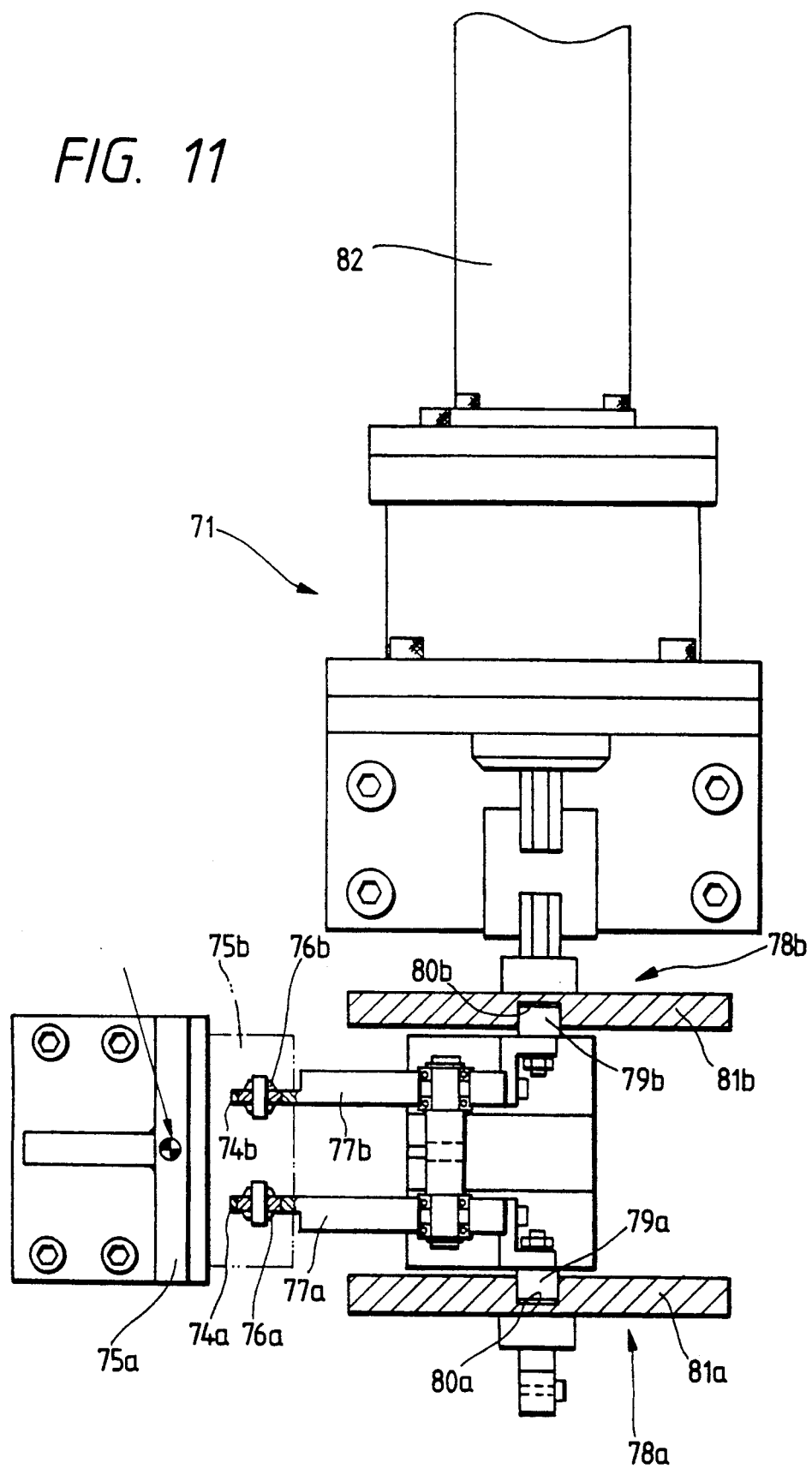
FIG. 11 is a plan view showing a structure of the clinch device or driver.
Figure 12:
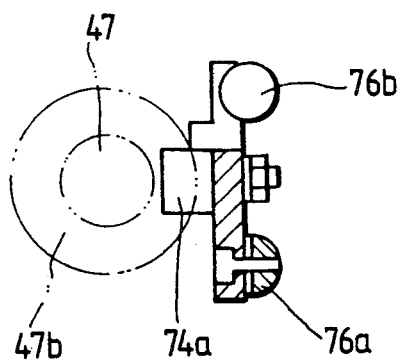
FIG. 12 is a sectional plan view showing the clinch device along the line XII—XII in FIG. 1.

As shown in FIG. 11, the cam members 81a and 81b are parallel and oppose each other on the same axis. The swinging levers 77a and 77b and the connecting rods 76a and 76b are also disposed adjacent to each other. As described above, the second thick shaft 47 is coaxial with the second thin shaft 48, as previously described. For this reason, the connecting rod 76a for connecting the swinging lever 77a and the second thick shaft 47 comprises a bent portion at its upper end, and this bent portion is bent to the left (i.e., toward the center of the second thick shaft 47 along its tangential line), as shown in FIG. 12. The thick shaft drive roller 74a is mounted on the distal end of the bent portion.

Figure 13:
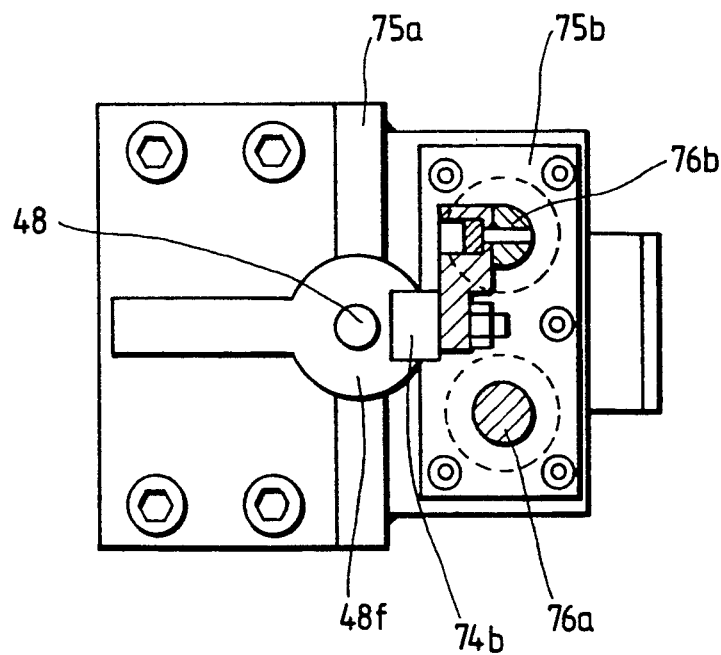
FIG. 13 is a sectional plan view of the clinch device along the line XIII—XIII in FIG. 1.

The connecting rod 76b for connecting the swinging lever 77b and the second thin shaft 48 comprises a bent portion at its upper end, and this bent portion is bent to the right (i.e., toward the center of the second thin shaft 48 along its tangential line), as shown in FIG. 13. The thin shaft drive roller 74b is mounted on the distal end of this bent portion.

Figure 14:
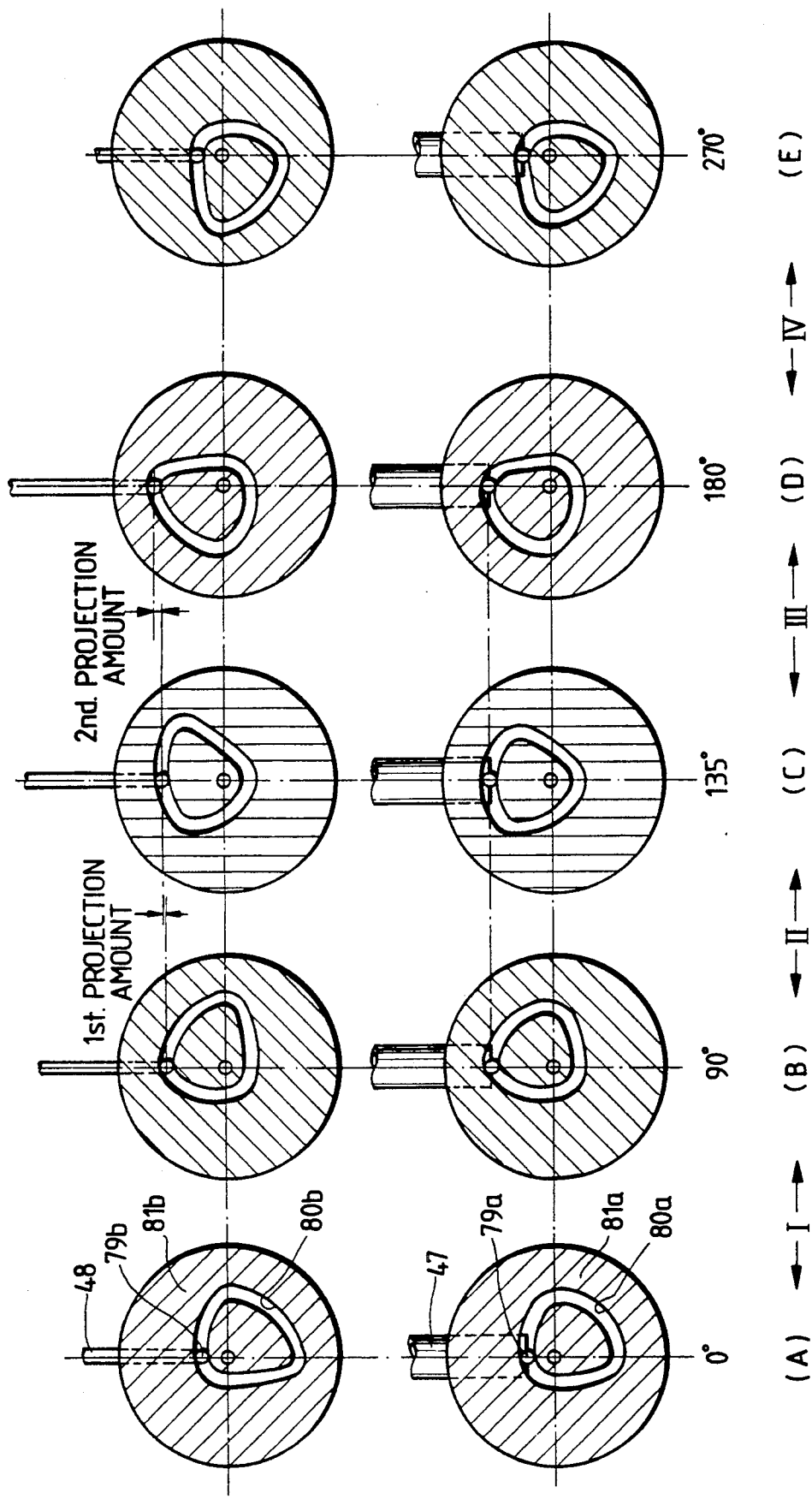
FIG. 14 is a view sequentially showing driven states of a cam mechanism.

The cam grooves 80a and 80b are constructed to perform the following operations as shown in states (A) to (E) in FIG. 14. More specifically, the state (A) in FIG. 14 represents a lowermost standby position of the clinch mechanism 43, the state (B) represents an uppermost standby position obtained by normally rotating the clinch mechanism 43 through 90° in the counterclockwise direction from the state (A) in FIG. 14, the state (C) represents a push-in position of the mechanism 43 upon its normal rotation through 45° in the counterclockwise direction from the state (B) in FIG. 14, the state (D) represents a clinch position obtained by rotating the clinch mechanism through 45° in the counterclockwise direction from the state (C) in FIG. 14, and the state (E) represents the lowermost position obtained by normally rotating the clinch mechanism through 90° in the counterclockwise direction from the state (D) in FIG. 14.

FIGS. 15A to 15E show operating states of the head mechanism 18A and the clinch mechanism 43A in correspondence with the states (A) to (E) in FIG. 14.

Figure 15A:
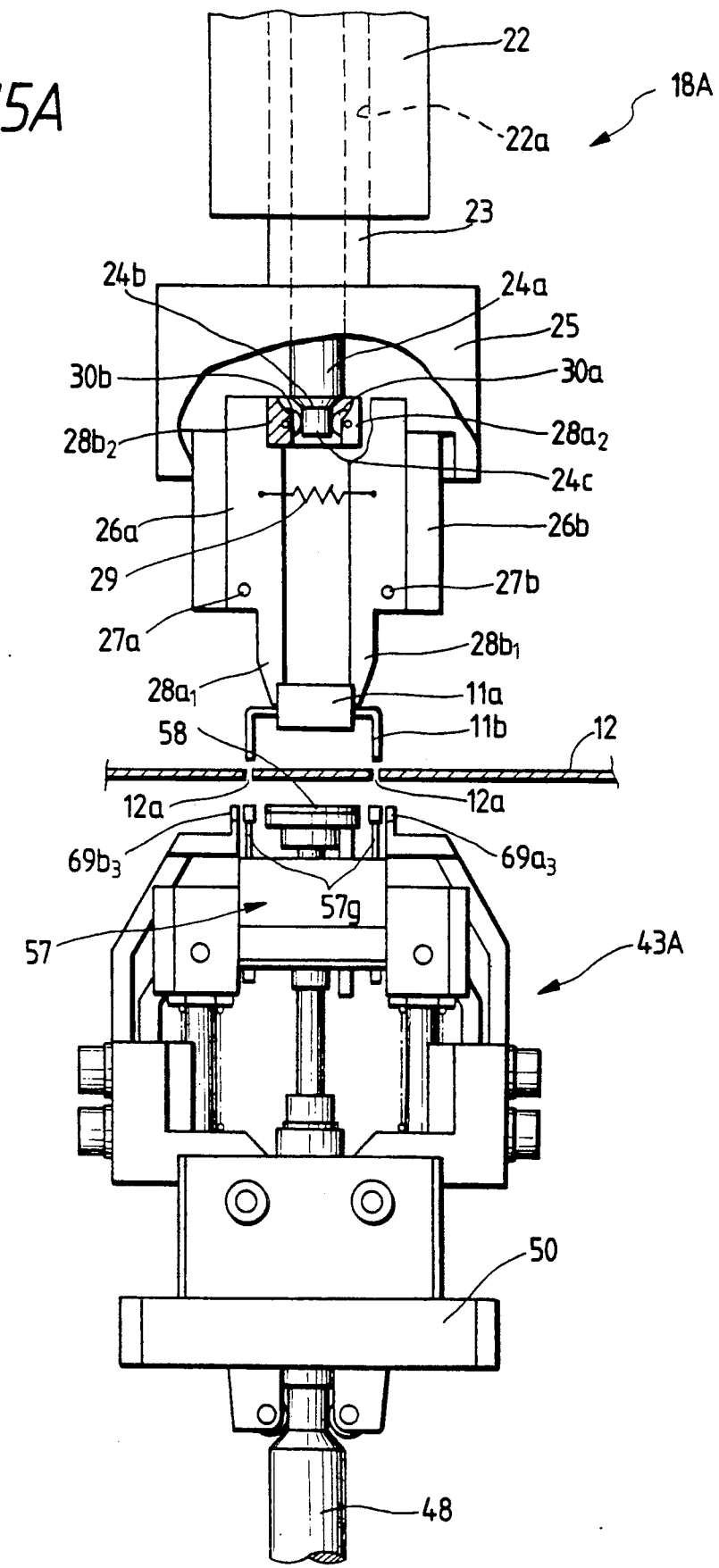
FIGS. 15A to 15E are front views showing an operation sequence of the head and clinch mechanisms for IC insertion and its clinching in states respectively corresponding to states (A) to (E) in FIG. 14.

The cam grooves 80a and 80b are formed to have identical cam shapes such that the clinch body 49 of the clinch mechanism 43A located at the clinch position is moved upward from the lowermost position in FIG. 15A without changing the relative distance between the second thick shaft 47 and the second thin shaft 48 so as to gradually increase a distance from the center of rotation during an ascending operation I (0° to 90°) for changing the state (A) in FIG. 14 to the state (B) in FIG. 14. In the uppermost position shown in FIG. 15B, the support member 58 is brought into contact with the lower surface portion of the printed circuit board 12 into which the IC 11 is inserted.

Figure 15B:
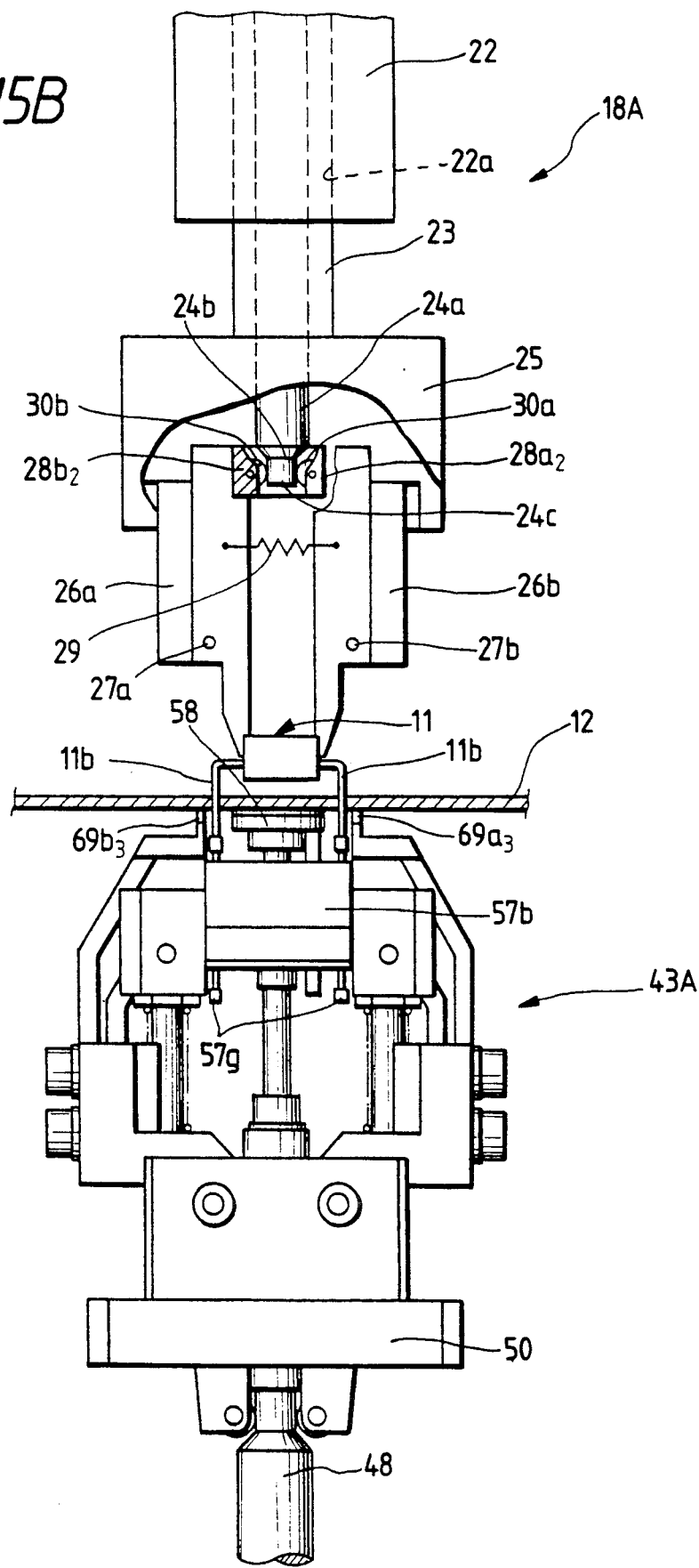

After the support member 58 supports the lower surface of the printed circuit board 12, the gripper portion in the head mechanism 18A is moved to the lowermost position, and the IC 11 gripped by the gripper portion is inserted into the printed circuit board 12, as shown in FIG. 15B. More specifically, the lead wires 11b are inserted into a plurality of through holes 12a formed in the printed circuit board 12 from the above, respectively.

In the push-down operation II (90° to 135°) for changing the state (B) in FIG. 14 to the state (C) in FIG. 14, the cam groove 80a which defines the operation of the second thick shaft 47 is set such that a distance from its center of rotation is not changed. On the other hand, the cam groove 80b for defining the operation of the second thin shaft 48 is set such that a distance from the center of rotation is not changed in the range up to 95° and is gradually increased in the range exceeding 95°. A lift amount (i.e, an ascending distance of the cam follower 79b from the state (B) in FIG. 14 to the state (C) in FIG. 14) of the cam is defined as the first extension amount.

The range of the rotation angle from 90° to 95° is defined as a detection range. In this detection range, the IC 11 is inserted into the printed circuit board 12 by the head mechanism 18A, and the detection pins 58g of the detection unit 57 are pushed down by the corresponding lead wires 11b of the inserted IC 11.

Figure 15C:
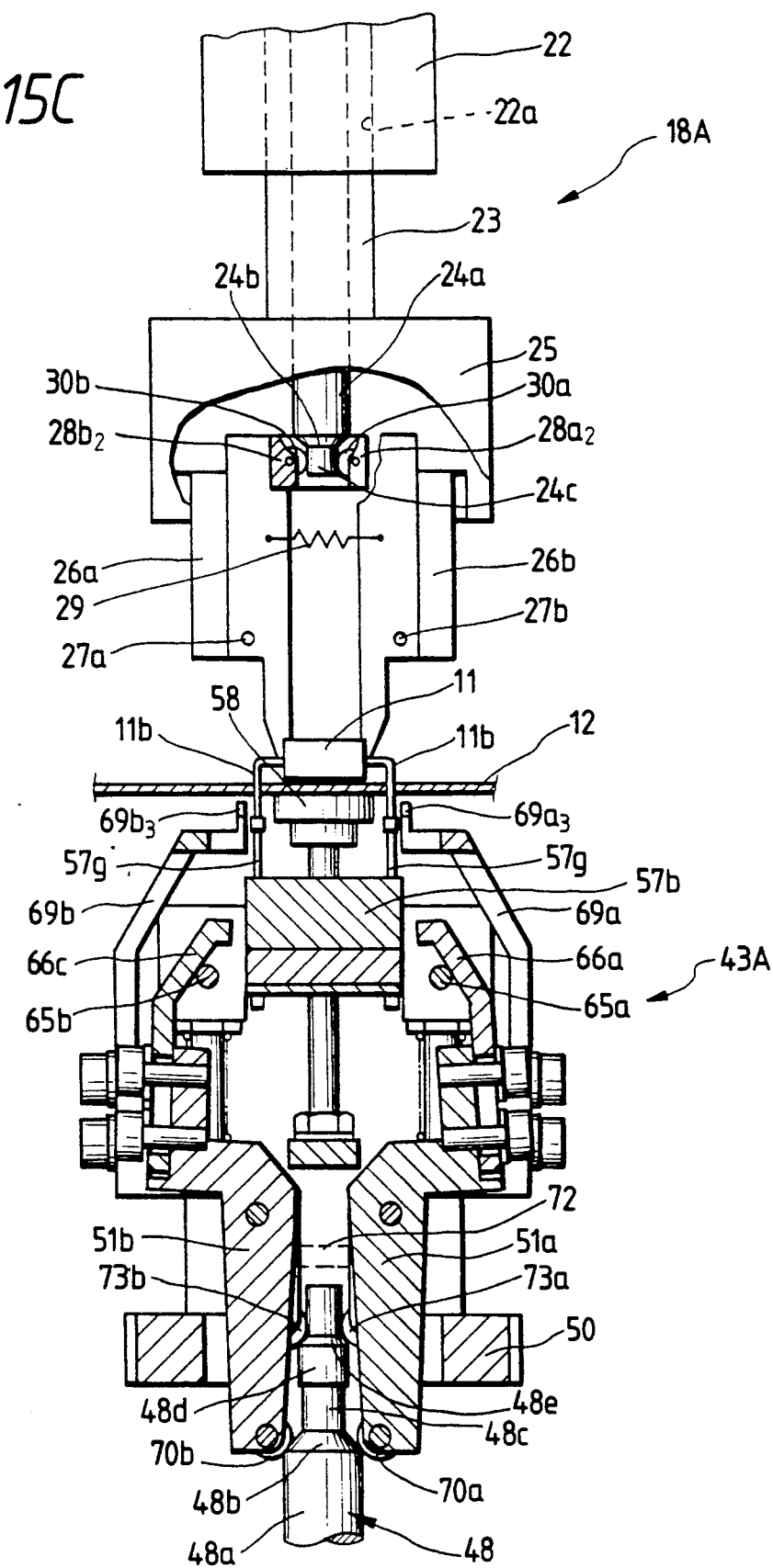
Figure 15D:
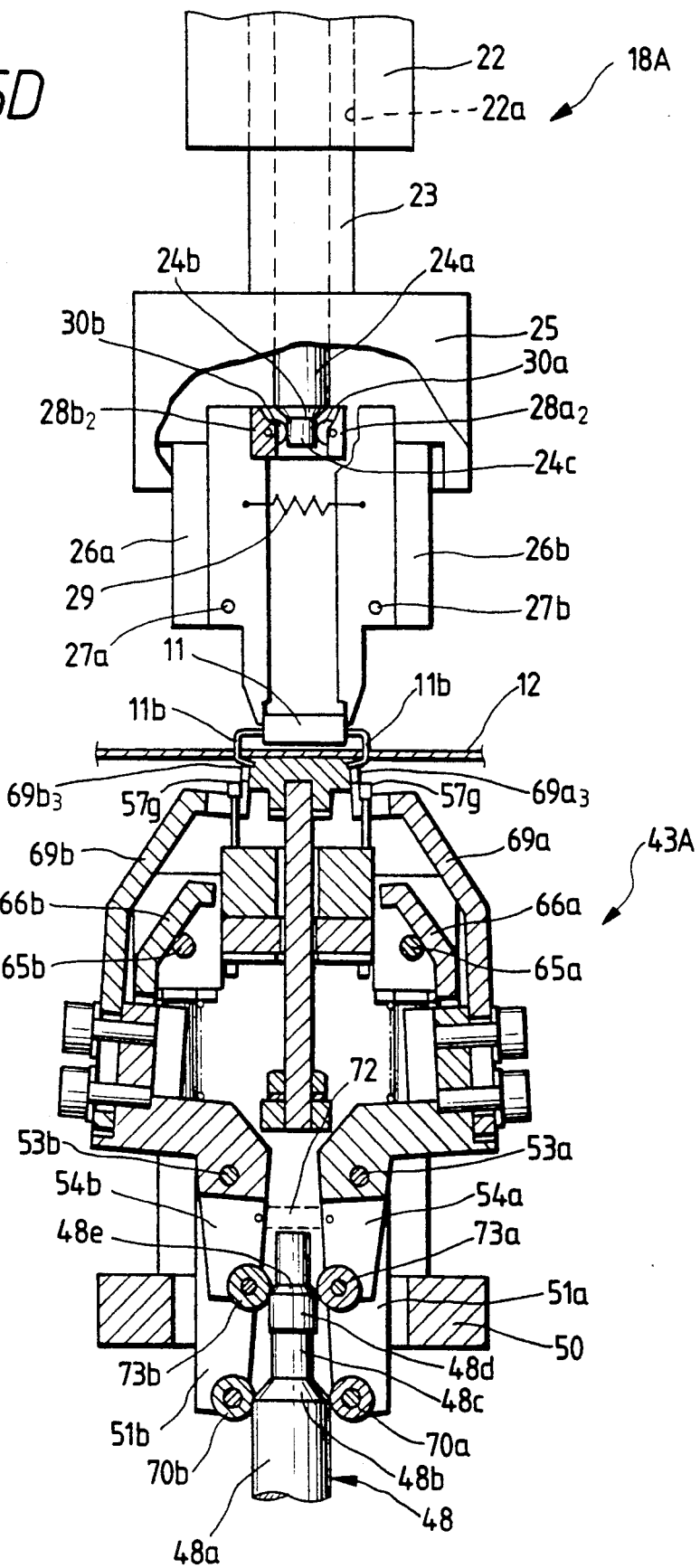
Figure 15E:
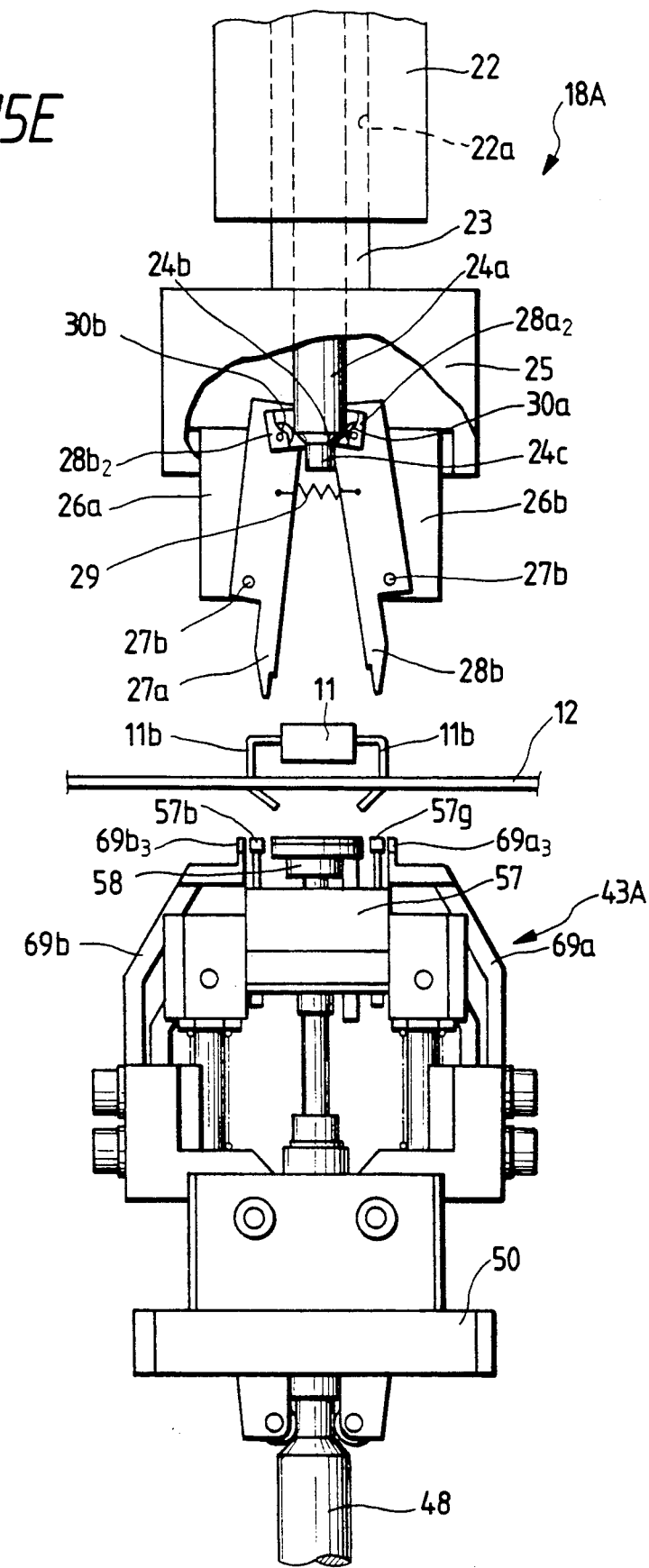

When the rotation angle reaches 135°, the second thin shaft 48 extends above the upper end of the second thick shaft 47 by the first extension amount, as shown in FIG. 15C. In this manner, when both the cam members 81a and 81b are pivoted to the state (C) in FIG. 14, the push-down operation is completed.

In a clinch operation III (135° to 180°) for changing the state (C) in FIG. 14 to the state (D) in FIG. 14, the cam groove 80a for defining an operation of the second thin shaft 47 is defined not to change a distance from the center of rotation as in the push-down operation II. On the other hand, the cam groove 80b for defining the operation of the thin shaft 48 is defined to gradually increase the distance from the center of rotation. A lift amount of the cam (i.e., an ascending distance of the cam follower 79b from the state (C) in FIG. 14 to the state (D) in FIG. 14) is defined as the second extension amount.

As shown in FIG. 3A, the second thin shaft 48 further extends above the upper end of the second thick shaft 47 by the second extension amount. When the cam members 81a and 81b are pivoted to the state (D) in FIG. 14, the clinch operation is completed. In this embodiment, the clinch operation is performed after the push-down operation is performed. The connecting pins $11b_1$, $11b_2$, $11b_3$, and $11b_4$ located at the four corners are bent inward by the four clinch elements $69a_3$, $69a_4$, $69b_3$, and $69b_4$, respectively.

In a descending operation IV (180° to 270°) for changing the state (D) in FIG. 14 to the state (E) in FIG. 14, both the cam grooves 80a and 80b have identical shapes to gradually reduce the distances from the center of rotation so as to move clinch mechanism 43 located at the upper position downward without changing the relative distance between the second thick shaft 47 and the second thin shaft 48. At the lowermost position shown in FIG. 15E, the clinch mechanism 43 is moved downward to the same level shown in the state of FIG. 15A while keeping the clinch position.

In a return operation V (270° to 360°, i.e., 0°) for changing the state (E) in FIG. 14 to the state (A) in FIG. 14, the cam groove 80a for defining the operation of the second thick shaft 47 is set not to change the distance from the center of rotation. On the other hand, the cam groove 80b for defining the operation of the second thin shaft 48 is set to gradually reduce the distance from the center of rotation. A descending amount of the cam (i.e., a descending distance of the cam follower 79b from the state (E) in FIG. 14 to the state (A) in FIG. 14) is set to be a sum of the first and second extension amounts. As a result, as shown in FIG. 15A, the second thin shaft 48 extends above the upper end of the second thick shaft 47 by a predetermined amount. In this manner, both the cam members 81a and 81b return to obtain the state (A) in FIG. 14.

A control sequence of the control unit 21 for the insert and clinch operations of the IC 11 will be described with reference to FIGS. 16A, 16B, and 17.

The control unit 21 drives the first to fourth motors 15, 36, 44, and 82 through the first to fourth motor drivers 20a, 20b, 45a, and 45b, respectively. Drive amounts (rotation amounts) for these motors are always detected by the control unit 21 through a rotary encoder (not shown), and the first to fourth motors 15, 36, 44, and 82 are controlled on the basis of the detected rotation amounts, respectively.

The control unit 21 has a first control sequence for pickup and insert operations in the head apparatus 13 and a second control sequence for a clinch operation in the clinch apparatus 14. The first control sequence is shown in FIGS. 16A and 16B, and the second control sequence is shown in FIG. 17.

The first control sequence (pickup and insert control sequence) in the control unit 21 will be described with reference to FIGS. 16A and 16B.

When an operation start signal is detected in step S10, the head No. waiting with the next IC to be inserted is read in step S12. In step S14, a first rotation amount R1 for the head to reach the insert position is measured. In step S16, the head No. waiting with the IC to be picked up is read. In step S18, a second rotation amount R2 of the head to reach the pickup position is measured.

In step S20, the first and second rotation amounts R1 and R2 respectively read in steps S14 and S18 are compared with each other to determine whether the first rotation amount R1 is smaller than the second rotation amount R2. If NO in step S20, i.e., when it is determined that the second rotation amount R2 is smaller than the first rotation amount R1, a driving signal is output to the first motor driver 20a to drive the first motor 19 so as to rotate the first rotary table 18 in the counterclockwise direction in step S22.

The operation in step S22 continues until the rotation amount of the first motor 19 becomes the second rotation amount R2 in step S24. When it is determined in step S24 that the first rotary table 17 is rotated by the second rotation amount R2, a motor stop signal for the first motor 19 is output to the first motor driver 20a in step S26. In step S28, the pickup operation of the IC 11 is performed by the head mechanism 18B pivoted to the pickup position through an insert device (not shown).

In step S20, as it is determined that the second rotation amount R2 for pivoting the head mechanism for gripping the IC to be picked up to the pickup position is smaller than the first rotation amount R1 for pivoting the head mechanism which grips the IC 11 to be inserted next to the insert position, the first rotary table 17 has rotated by the second rotation amount R2. The head mechanism 18 which grips the IC 11 to be inserted next does not reach the insert position.

For this reason, in step S28, upon completion of the pickup operation, the flow returns to step S12 to compare the first rotation amount R1 for pivoting the head mechanism which grips the IC to be inserted next to the insert position is compared with the second rotation amount R2 for pivoting the head mechanism 18 which grips the IC 11 to be picked up next to the pickup position.

If YES in step S20, i.e., it is determined that the first rotation amount R1 is smaller than or equal to the second rotation amount R2, a driving signal is output to the first motor driver 20a to drive the first motor 19 so as to rotate the first rotary table 17 in the counterclockwise direction in step S30. The operation in step 30 continues until the rotation amount of the first motor 19 reaches the first rotation amount R1 in step S32. When it is determined that the first rotary table 17 is rotated by the first rotation amount R1 in step S32, a motor stop signal for the first motor 19 is output to the first motor driver 20a in step S34.

It is determined in step S36 whether the first rotation amount R1 is equal to the second rotation amount R2. If YES in step S36, i.e., it is determined that the first rotation amount R1 is equal to the second rotation amount R2, the head mechanism 18 to be picked up has rotated to the pickup position. In step S38, the pickup operation of the IC 11 is performed by the head mechanism 18B rotated to the pickup position. The flow then advances to step S40. However, if NO in step S36, i.e., it is determined that the first rotation amount R1 is not equal to the second rotation amount R2, the head mechanism 18 to be picked up does not reach the pickup position. In this case, the operation in step S38 is not performed, and the flow directly jumps to step S40.

In step S40, a first driving signal is output to the second motor driver 20b to rotate the second motor 36 in the insert device 32 in a normal direction (i.e., counterclockwise direction). Thereafter, in step S42, it is determined that the rotation amount of each of the cam members 81a and 81b at the clinch device 71 reaches 95°. When it is determined in step S42 that the rotation amount of each of the cam members 81a and 81b reaches 95° (i.e., a rotation amount advanced by 5° upon the start of the push-down operation), it is determined in step S44 whether a latch signal is output from the latch circuit 63 at that time.

If YES in step S44, i.e., if it is determined that the LED 61 is turned on and the latch signal is output from the latch circuit 63, it is determined that the IC 11 is correctly inserted into the printed circuit board 12 by the head mechanism 18A and all the lead wires 11b extend below the printed circuit board 12. The first driving signal output to the second motor driver 20b in step S40 continues. As a result, as described above, the insert operation of the IC 11 continues. After the gripper portion inserts the IC 11 into the printed circuit board 12, gripping is released. The IC 11 is left on the printed circuit board 12, and the gripper portion is moved upward.

When it is determined in step S46 that the rotation amount of each of the drive cam mechanisms 35 and 35b in the insert device 32 reaches 360°, a motor stop signal for the second motor 19 is output to the second motor driver 20b. Driving of the insert device 32 is stopped while the empty gripper portion returns to the uppermost position in the head mechanism 18A. A series of operations in the first control sequence in the head apparatus 13 are completed.

If NO in step S44, i.e., if it is determined that the LED 61 is kept off and the latch signal is not output from the latch circuit 63 even when the rotation amount is increased by 5° upon the start of the push-down operation, it is determined that the IC 11 is not correctly inserted into the printed circuit board 12 by the head mechanism 18A and at least one lead wire 11b does not extend below the printed circuit board 12. In this case, in steps S50, a second driving signal is output to the second motor driver 20b to rotate the second motor 19 in the reverse direction. As a result, the gripper portion in the head mechanism 18A holds the IC 11 which is not correctly inserted into the printed circuit board 12. In this state, the reverse operations are performed until the rotation amount of each of the both the drive cam mechanisms 35a and 35b returns to 0° in the insert device 32 in step S52.

When it is determined in step S52 that the rotation amount of each of both the drive cam mechanisms 35a and 35b returns to 0°, a motor stop signal for the second drive motor 19 is output to the second motor driver 20b in step S54. Driving of the insert device 32 is stopped while the gripper portion which grips the failed IC 11 at the head mechanism 18A returns to the uppermost position. In step S56, an alarm for insertion failure of the IC 11 on the printed circuit board 12 is generated, and the first control sequence is completed.

In the first control sequence, the control unit 21 drives (normal rotation) both the drive cam mechanisms 35a and 35b by one revolution to complete one insert cycle and/or one pickup cycle. When the insertion failure of the IC 11 is detected by the detection operation performed prior to the clinch operation, both the drive cam mechanisms 35a and 35b are rotated in the reverse direction at the time of detection. The gripper portion is moved upward while the gripper portion keeps gripping the failed IC 11. The gripper portion returns to the zero rotation amount, i.e., the original position, of the drive cam mechanisms 35a and 35b.

As a result, according to this embodiment, even if an insertion failure of the IC 11 occurs, the operations up to the detection of the insertion failure of the IC 11 are performed in a reversed order to easily eliminate insertion failure, i.e., removal of the IC 11 from the printed circuit board 12 before the clinch operation is performed. Therefore, a resetting operation for insertion failure can be easily performed.

The second control sequence (clinch control sequence) in the control unit 21 will be described with reference to the control unit 21.

More specifically, the operation start signal is detected in step S58, in the control sequence of the head apparatus 13, a driving signal is output to the third motor driver 45a to cause the third motor 44 to rotate the second rotary table 42 by the same rotation amount as that of the first motor 19.

Upon execution of the operation in step S60, the clinch mechanism 43 is rotated and driven in a state synchronized with rotation and driving of the head mechanism 18 of the head apparatus 14. When the head mechanism 18 which grips the IC 11 to be inserted is rotated to the insert position, the clinch mechanism 43 corresponding to the IC 11 to be inserted is rotated to the clinch position in the clinch apparatus 14. When the clinch mechanism 43 is pivoted to the clinch position, a motor stop signal for the third motor 44 is output to the third motor driver 45a.

Thereafter, in step S64, a third driving signal is output to the fourth motor driver 45b to rotate the fourth motor 82 in the normal direction (i.e., the counterclockwise direction). The ascending operation is performed on the basis of the third driving signal to change the state from the state in FIG. 15(A) to the state in FIG. 15(B), and the detection operation is then performed.

It is determined in step S66 that the rotation amount of each of the cam members 81a and 81b in the clinch device 71 reaches 95°. When it is determined in step S66 that the rotation amount of each of the cam members 81a and 81b is 95°, i.e., when it is determined that the detection operation is completed, it is determined in step S68 whether the latch signal is output from the latch circuit 63 at that time as in step S44.

If YES in step S68, i.e., when it is determined that the LED 61 is turned on and the latch signal is output from the latch circuit 63, the third driving signal is kept output to the four motor driver 45b in step S64. As described above, after the push-down operation of the detection unit 57 is completed, the clinch operation of the lead wires 11b of the IC 11 is performed. Finally, the clinch body 49 is moved downward to the prescribed position.

When it is determined in step S70 that the rotation amount of each of the cam members 81a and 81b in the clinch device 71 reaches 360°, a motor stop signal for the fourth motor 82 is output to the fourth motor driver 45b in step S72, and driving of the clinch device 71 is stopped while the clinch device 71 returns to the lowermost position upon completion of the clinch operation in the clinch mechanism 43A. As a result, a series of control operations in the second control sequence for the clinch apparatus 14 in the normal state are completed.

If NO in step S68, i.e., when it is determined that the LED 61 is kept off and the latch signal is not output from the latch circuit 63 upon completion of the detection operation, it is determined that at least one lead wire 11b does not extend below the printed circuit board 12. A fourth driving signal for reversing the fourth motor 82 is output to the fourth motor driver 45b in step S74. As a result, the clinch body 49 in the clinch mechanism 43A is moved in a direction opposite to the above operation, and this reverse driving continues until the rotation amount of each of the cam members 81a and 81b in the clinch device 71 is detected to be 0° in step S76.

When it is determined in step S76 that the rotation amount of each of the cam members 81a and 81b returns to 0°, a motor stop signal is output to the fourth motor driver 45b in step S78. In a state immediately preceding the clinch operation of the clinch mechanism 43A, driving of the clinch device 71 is stopped while the clinch mechanism 43A returns to the lowermost position. In this manner, the operation for insertion failure is performed, and the second control sequence is completed.

In the second control sequence, the control unit 21 performs one clinch cycle upon simultaneous driving (normal rotation) of the cam members 81a and 81b by one revolution. When an insertion failure of the IC 11 is detected in the detection operation performed prior to the clinch operation, the cam members 81a and 81b are rotated in the reverse direction upon detection of the insertion failure. The IC 11 determined as the insertion failure is not clinched, and the clinch body 49 is moved downward to the original position, i.e., 0° rotation of the cam members 81a and 81b.

As a result, according to this embodiment, even if an insertion failure of the IC 11 occurs, the clinch operation of the IC 11 is not yet performed. Therefore, the above operations up to detection of insertion failure are reversed, and the IC 11 can be easily and automatically removed by the head mechanism 43A without clinching the lead wires 11b.

As described above, the clinch apparatus of this embodiment comprises a movable body, a plurality of clinch means arranged along a moving direction of the movable body, each of the clinch means which is moved to a clinch position being operated to bend lead wires of an electronic part inserted into the printed circuit board, a detecting means, arranged in each of the clinch means, for detecting completion of insertion of the lead wires of the corresponding electronic part into the printed circuit board, a light-emitting means, connected to each detecting means, for emitting light upon completion of the insertion operation, a single light-receiving means, arranged to oppose the light-emitting means of the clinch means, for receiving light from the light-emitting means, and control means, connected to the light-receiving means, for causing the clinch means located at the clinch position to bend the corresponding lead wires on the basis of light reception at the light-receiving means.

In the clinch apparatus of this embodiment, the IC has a plurality of lead wires. When completion of insertion of all the lead wires is detected, the detecting means causes the light-emitting element to emit light. When incomplete insertion of at least one lead wire is detected, the detecting means does not cause the light-emitting element to emit light.

In the clinch apparatus of this embodiment, the movable body is rotatably supported. The plurality of clinch means are arranged on the outer surface of the movable body at equal angular intervals.

According to this embodiment, there is provided a clinch apparatus wherein the control means is coupled to the detecting means for detecting an insert state of the lead wires of the electronic part in a noncontact state so as to eliminate direct wiring cables therebetween and to prevent entangling of the wiring cables, thereby reducing connecting cost and hence total cost.

The second embodiment of the present invention will be described in detail with reference to the accompanying drawings.

Figure 18D:
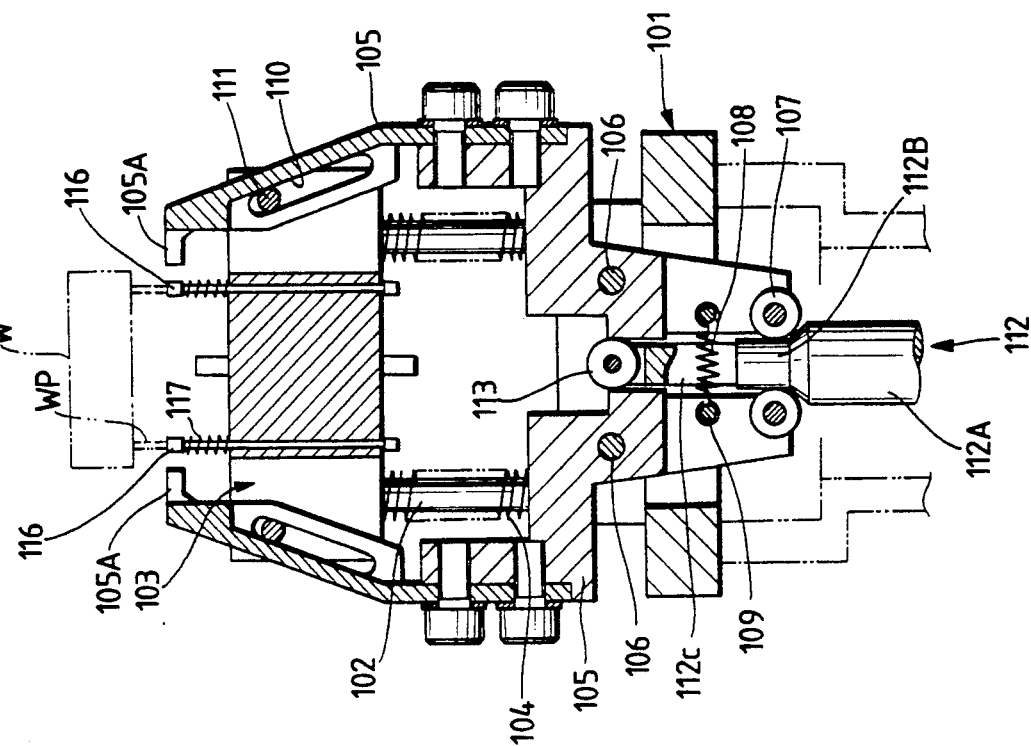
FIG. 18D is a sectional view showing the inserting/checking apparatus along the line A—A in FIG. 18C, FIGS. 19A and 19B are sectional views showing relationships between a lead holding pin and a block member and between upper and lower electro-conductive plates, respectively.
Figure 18C:
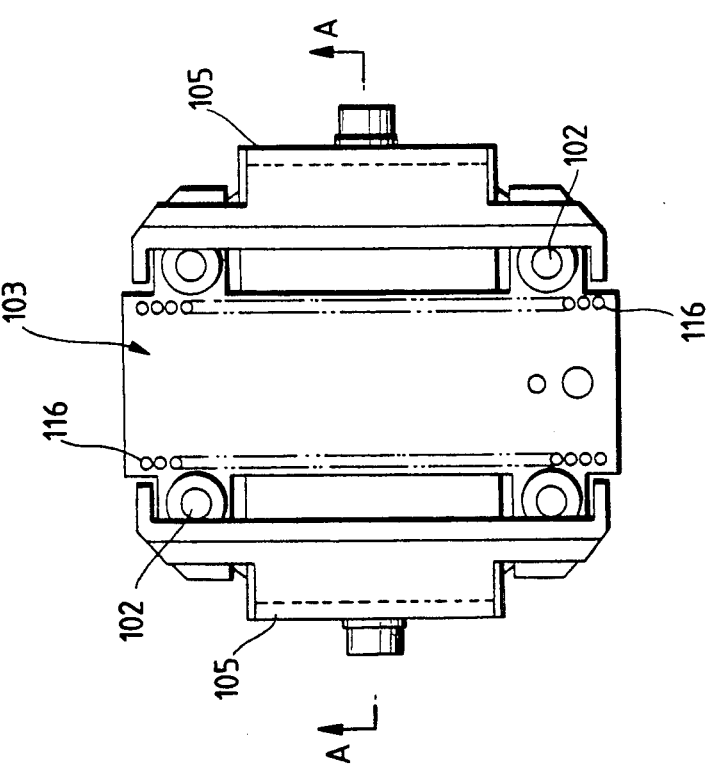

FIGS. 18A to 18D show the second embodiment of the present invention, in which FIG. 18A is a front view thereof, FIG. 18B is a side view thereof, FIG. 18C is a plan view thereof, and FIG. 18D is a sectional view thereof along the line A—A in FIG. 18C. The parts inserting apparatus of the second embodiment includes a base member 101, guide shafts 102 extending upright on the base member 101, a block member 103 vertically slidable along the guide shafts 102, block return springs 104 mounted on the guide shafts 102 to keep the block member 103 in an illustrated state prior to an operation, and a pair of gripper members 105. The gripper members 105 are swingably supported by support shafts 106 extending on the base member 101. A roller 107 is mounted on the lower end portion of each gripper member 105, and a pin 109 for locking a spring 108, as shown in FIG. 18D, is mounted between the corresponding support shaft 106 and the corresponding roller 107.

An elongated hole 110 is formed in each gripper member 105, and each pin 11 is fitted in the corresponding hole 110. When the gripper members 105 are pivoted inward about the support shafts 106 (to be described later), the pins 111 are slid along the corresponding holes 110, so that the block member 103 can be moved downward along the guide shafts 104. A rod 112 is vertically supported on the base member 101. The rod 112 has a large-diameter portion 112A, a medium-diameter portion 112B, and a small-diameter portion 112C, as shown in FIG. 18D. A roller 113 having a diameter slightly larger than that of the small-diameter portion 112C is mounted on the small-diameter portion 112C.

In a state of a test apparatus prior to its operation, the rollers 107 of the gripper members 105 are brought into tight contact with the medium-diameter portion 112B of the rod 112 by a biasing force of a spring 108, as shown in FIG. 18D. At the same time, the gripper members 105 are in contact with the roller 113 of the rod 112 from both sides.

Figure 19A:
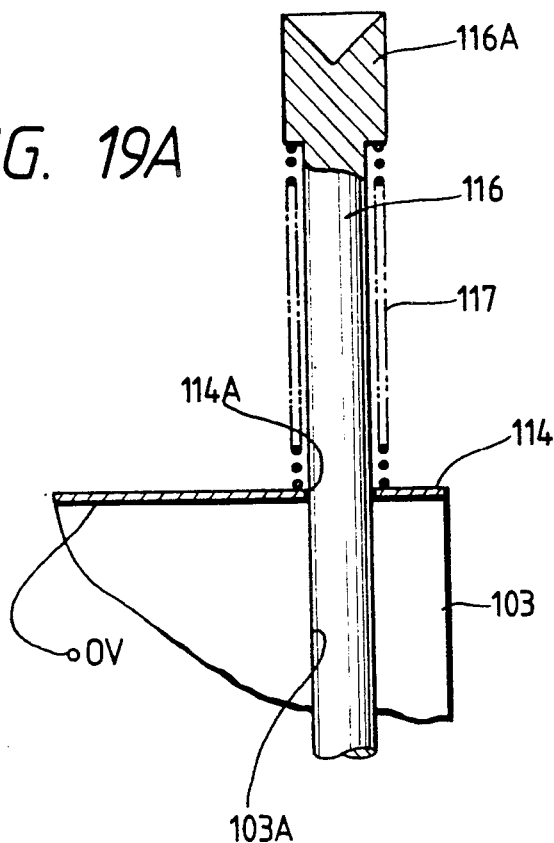
Figure 19B:
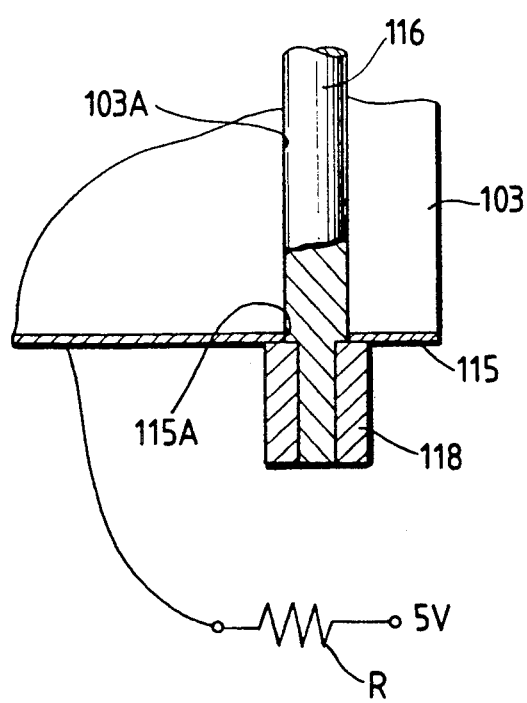

The block member 103 will be described in detail with reference to FIGS. 19A and 19B. The block member 103 cooperates with the gripper members 105 and is associated with lead bending and checking of an insert state when an electronic part (not shown) is mounted on a printed circuit board. The block member 103 itself is made of an insulating material. Electro-conductive plates 114 and 115 are adhered to the upper and lower surfaces of the block member 103. Through holes 114A and 115A each having the same number of a plurality of lead holding pins (to be referred to as holding pins hereinafter) 116 for holding the lead tips of the electronic part together with the block member 103 are formed in the electro-conductive plates 114 and 115, respectively. The diameter of each through hole 115A formed in the lower electro-conductive plate 115 has a larger diameter than that of each through hole 103A of the block member 103 so as to obtain a good insulating effect between the lower electro-conductive plate 115 with the corresponding holding pin 116 made of a conductive material.

A pin reception portion 116A is formed at the tip of the holding pin 116 and can support the distal end of a lead wire of an electronic part (not shown). A compression spring 117 is inserted between the lead reception portion 116A and the upper electro-conductive plate 114 to bias the holding pin 116 upward, as shown in FIG. 19A. A stop member 118 having conductivity is mounted at the lower end of the holding pin 116, as shown in FIG. 19B. In a state wherein the holding pin 116 is biased by the spring 117, as shown in FIG. 19A, the stop member 118 is kept in contact with the lower electro-conductive plate 115. The upper electro-conductive plate 114 is kept at 0 V, and the lower electro-conductive plate 115 is kept at, e.g., 5 V through a resistor R.

Test and clinch operations of the electronic parts insertion test apparatus will be described below.

In a state wherein all lead wires WP of an electronic part W are inserted into a printed circuit board, when the lead wires WP are kept placed on the holding pins 116, as shown in FIG. 18D and a load is applied to the lead wires WP, all the holding pins 116 are pushed down by all the lead wires WP against biasing forces of the springs. All the stop members 118 of the holding pins 116 are moved downward, and the lower electro-conductive plate 115 is electrically disconnected from the holding pins 116, so that the lower electro-conductive plate 115 is kept at 5 V.

Figure 20:
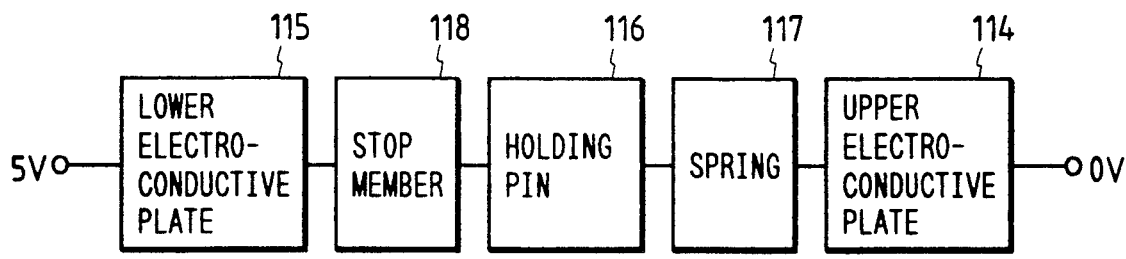

However, if the electronic part W is placed on the block member 103 so that at least one of the lead wires WP is not inserted into the printed circuit board, the holding pin 116 corresponding to the noninserted lead wire WP is not pushed down. A current flows in a path formed between the lower electro-conductive plate 115 and the upper electro-conductive plate 114 through the nondepressed holding pin 116, as shown in FIG. 20. The lower electro-conductive plate 15 is kept at 0 V, thereby detecting incomplete insertion of the electronic part W into the printed circuit board. The insert state is determined to be satisfactory or unsatisfactory in accordance with the voltage of 5 V or 0 V of the lower electro-conductive plate.

Figure 21:
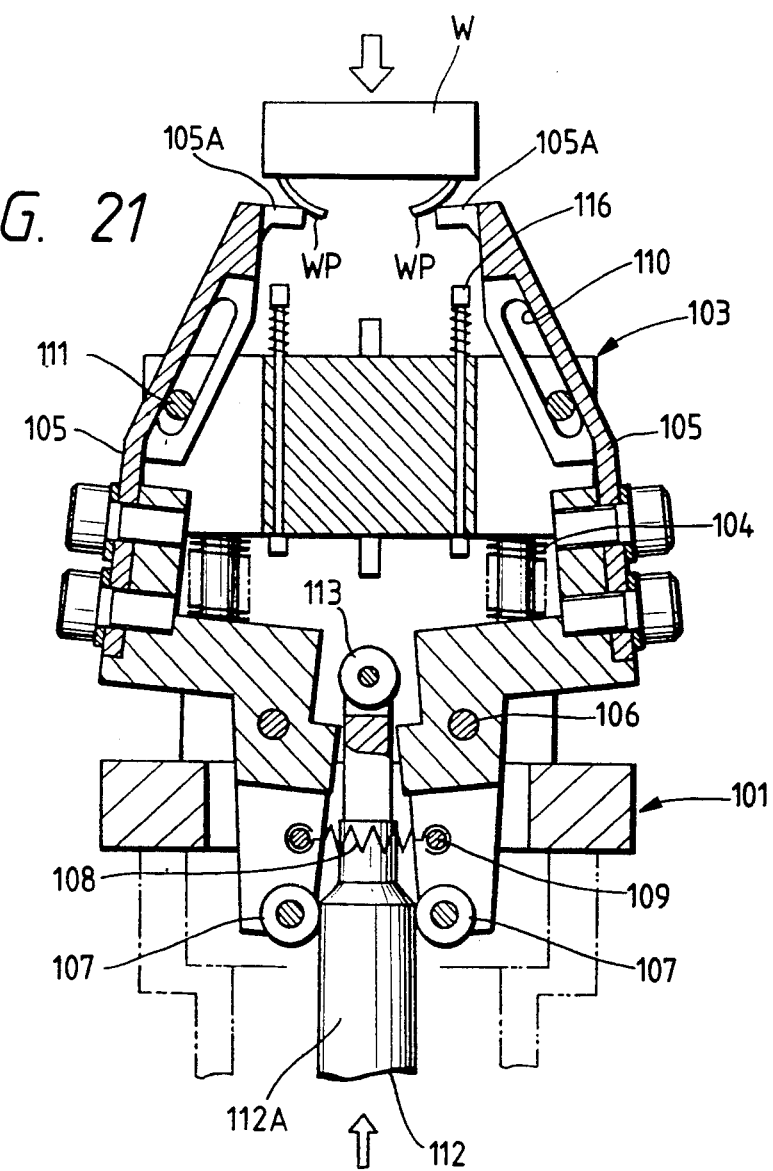

A clinch operation in this apparatus will be described with reference to FIG. 21. At the time of detection of the insert state, the roller 113 of the rod 112 is clamped between the gripper members 105, as shown in FIG. 18D, and the block member 103 is fixed together with the gripper members 105 in a state shown in FIG. 18A.

When a clinch operation is to be performed, the rod 112 is moved upward, as shown in FIG. 12, while the electronic part W is held in the state shown in FIG. 18D, and the large-diameter portion 112A is tried to be inserted between the rollers 107 against the biasing force of the spring 108. In this case, the roller 113 of the rod 112 is moved upward to release a locked state of the gripper members 105. The gripper elements 105A of the gripper members 105 are pivoted inward to bend the lead wires WP of the electronic part W inward.

In this case, the gripper members 105 are interdigitally swung about the support shafts 106, and the pins 111 of the block member 103 are slid along the holes 110 of the gripper members 105. The block member 103 is then moved downward against the biasing forces of the return springs 104. Therefore, the holding pins 116 are simultaneously moved downward and do not interfere bending by the gripper members 105.

According to this embodiment, as described above, unlike in a conventional arrangement, a gauge or any other complicated conduction test mechanism need not be arranged in the clinch apparatus. There are arranged an insulating block member for vertically supporting a plurality of lead holding pins and electro-conductive plates formed on the upper and lower surfaces of the block member. When all the lead wires are supported on the corresponding holding pins, a potential difference is generated between the upper and lower electro-conductive plates through the holding pins. With a simple arrangement, the insert state of each lead of the electronic part can be detected to be satisfactory or unsatisfactory. In addition, the block member is coupled to a pair of gripper members, and the block member is moved downward upon inward swinging of the gripper members. The lead wires are bent and the block member is moved downward and is retracted from the electronic member. Therefore, a clinch operation can be effectively practiced after testing of the insert state.

According to another effect of the present invention, when a pickup and insert operations of the head apparatus are to be performed, a function of preferentially performing one of the operations is provided to improve efficiency for a throughput per unit time.

Figures 1, 2, 16A:
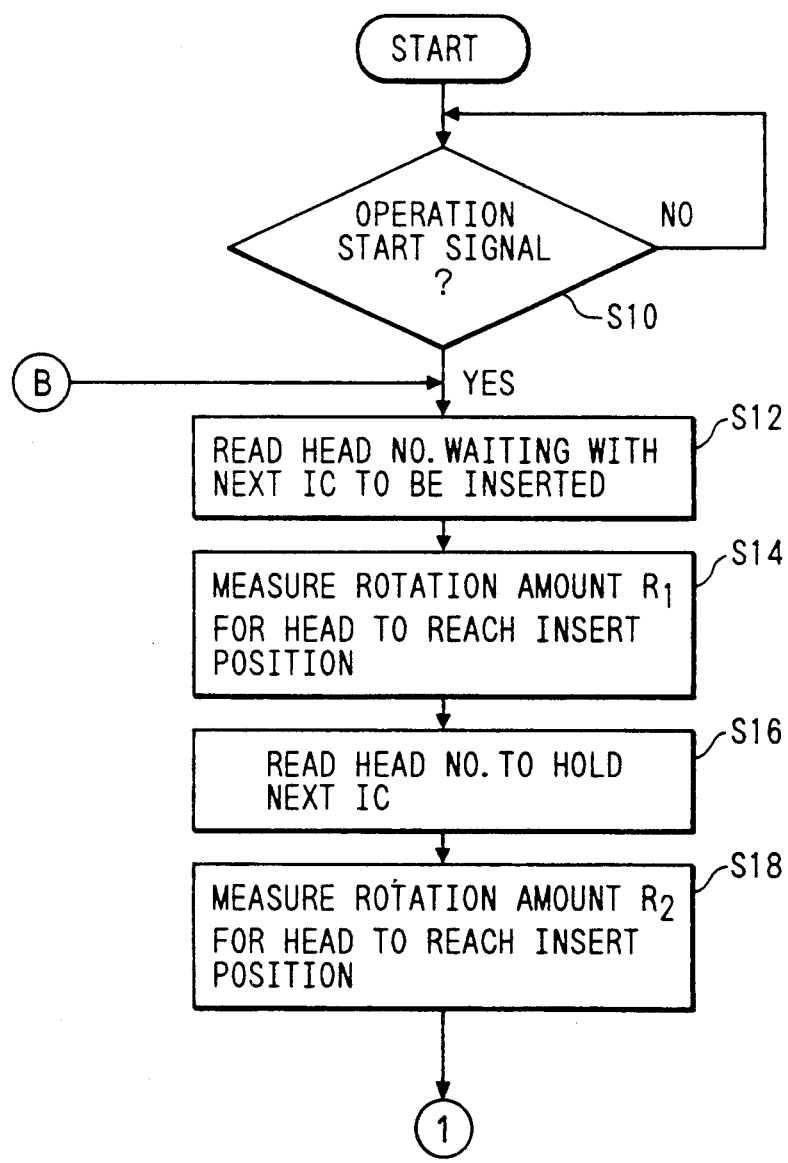
FIGS. 16A and 16B are flow charts showing a control sequence for the head mechanism in a control unit.
Figures 2, 16A:
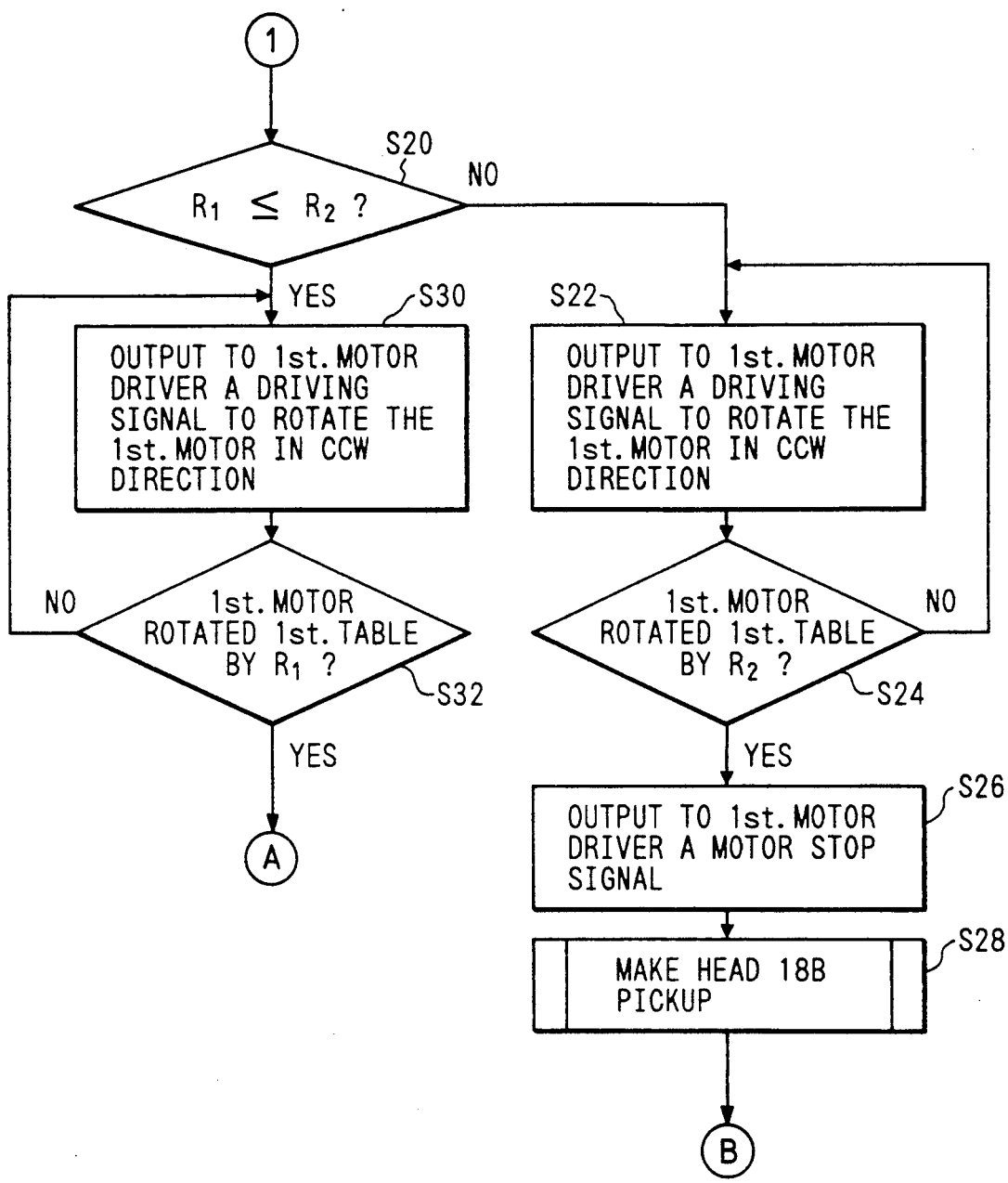
Figures 17, 17A:
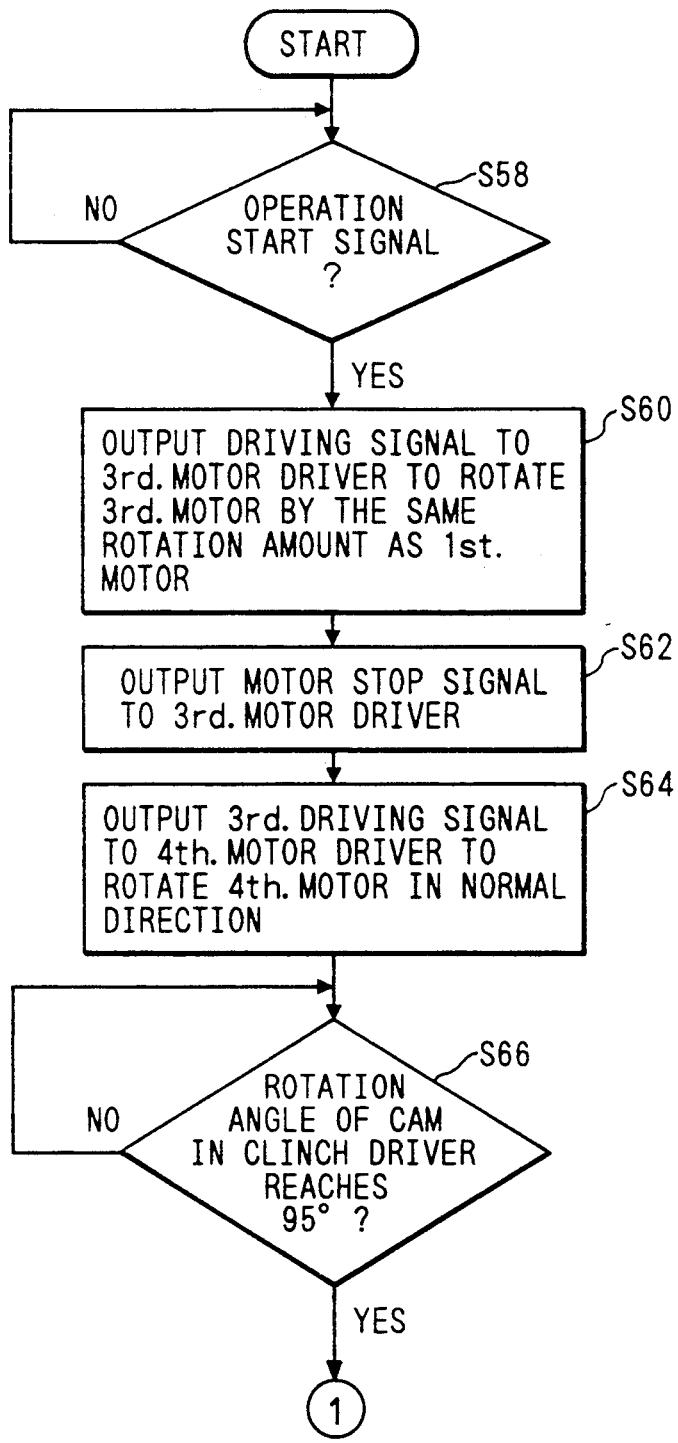
FIG. 17 is a flow chart showing a control sequence for the clinch mechanism in the control unit.
Figure 17B:
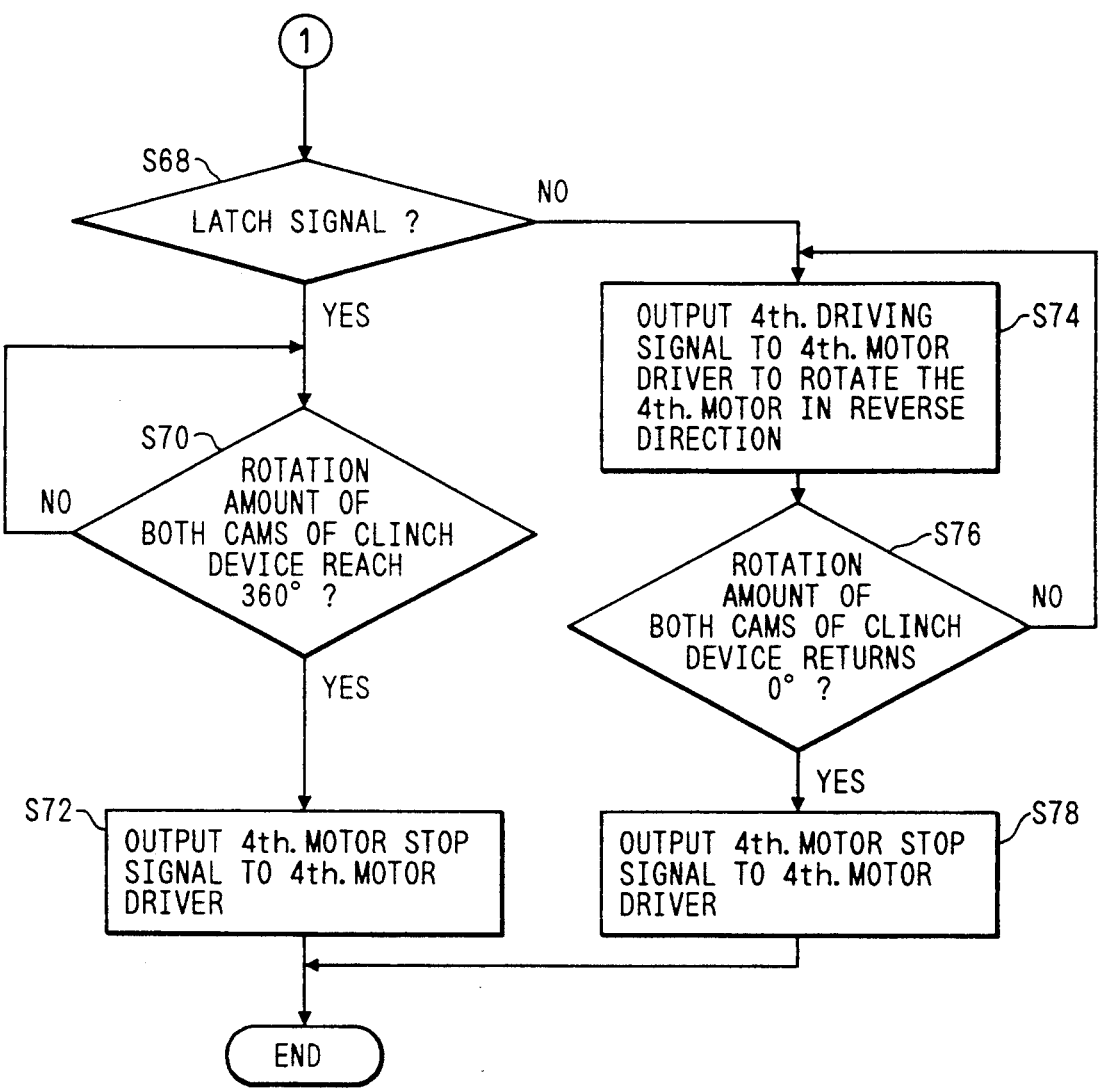

More specifically, in the process from step S14 to step S20 in FIG. 16A, the pickup and insert operations are measured, and the measured values are compared with each other. The next operation is preferentially selected on the basis of the comparison result, thereby improving efficiency of mounting electronic parts on printed circuit boards.

Figures 2, 16B:
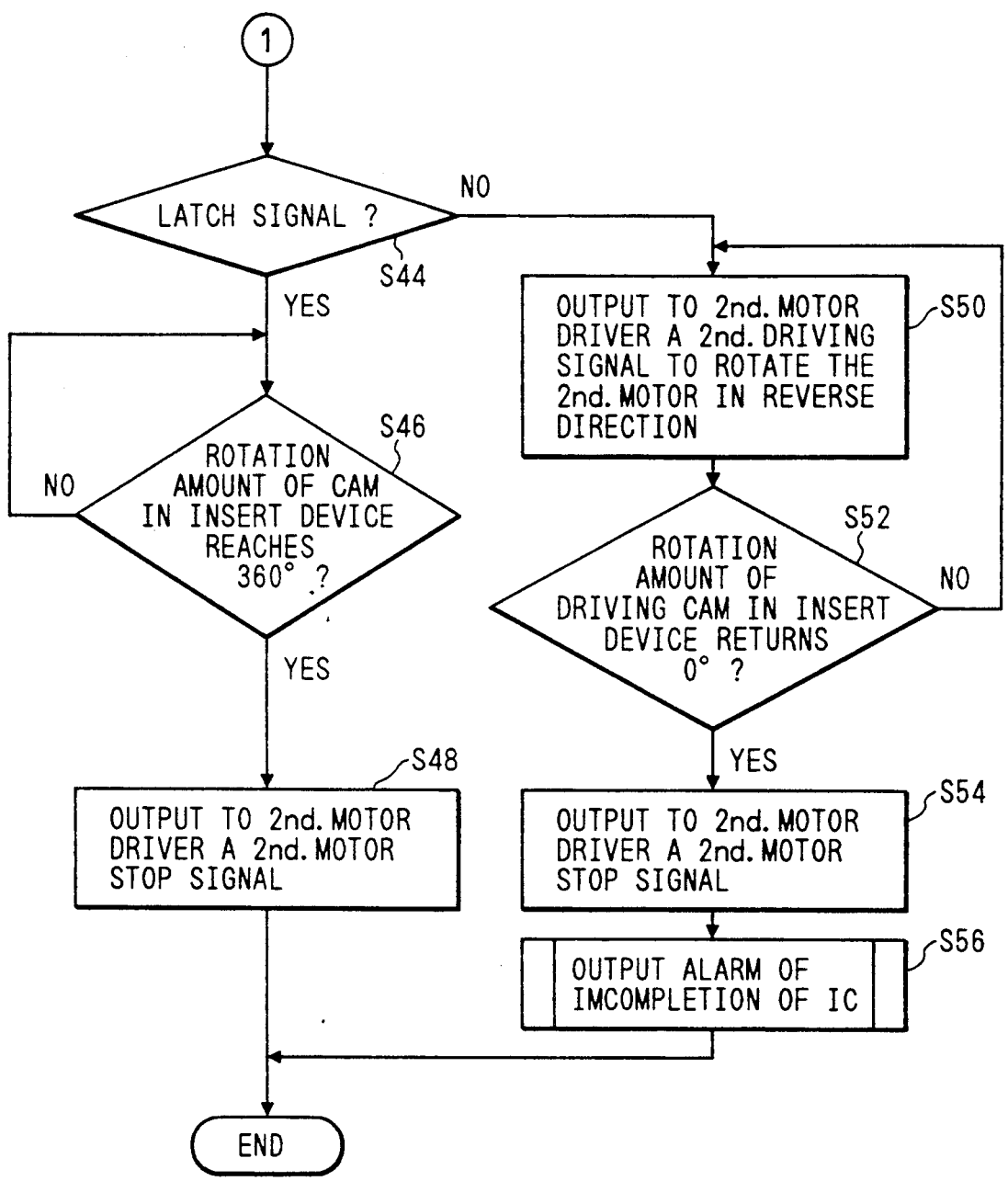

According to still another effect of the present invention, the present invention has the following function as shown in steps S40 to S52 in FIG. 16B. In step S42 of FIG. 16B, when it is determined in step S42 that the rotation amount is 95°, i.e, this amount is advanced by 5° upon the start of the push-down operation, the flow advances to step S44. In step S42, the lead wires 11b are brought into contact with detection terminals 57g at the 90° angular cam position in the state (B) of FIG. 14, as shown in FIG. 15(C). In this case, assume that the lengths of the lead wires 11b may vary. When variations in lengths of the lead wires are present, some lead wires which are not sufficiently in contact with the detection terminals. In the apparatus of the present invention, the cam is pivoted from the cam position represented by the state (B) in FIG. 14 to the cam position represented by the state (C) in FIG. 14 by 5°. By this angular displacement, the detection unit 57b in FIG. 15C is moved upward, and the contact states between the detection terminals 57g and the lead wires 11b can be compensated, thereby preventing insertion errors caused by the variations in lengths of the lead wires.

According to the present invention, when an insertion failure occurs after insertion of the lead wires into the printed circuit board is tested, a function of inhibiting the clinch operations (steps S50 and S52 in FIG. 16B) is provided. Therefore, the start of the clinch operation from the incomplete insert state can be prevented.

According to the present invention, there is also provided a method of inserting an electronic part by inserting lead wires of the electronic part into holes of a printed circuit board and clinching the lead wires, including new steps, thereby improving efficiency of mounting parts on the printed circuit board.

That is, there is provided a method of inserting lead wires into holes of an electronic part on a printed circuit board by using a head apparatus capable of moving the electronic part to a pickup position and an insert position where the electronic part is inserted into the holes of the printed circuit board, and a clinching means for clinching the lead wires of the electronic part, comprising the steps of picking up the electronic part to the head apparatus, moving the electronic part to the insert position on the printed circuit board, inserting the lead wires of the electronic part into holes in the printed circuit board, testing whether the lead wires are satisfactorily inserted into the holes, and clinching the inserted lead wires on the basis of a test result of the step of testing the lead wires. After all the lead wires inserted into the holes in the printed circuit board are confirmed to be satisfactorily inserted therein, the clinch operation is started, thereby preventing the clinch operation of the insertion-failed electronic part.

What is claimed is:

1. A method of mounting an electronic part into a printed circuit board by a head device movable to a pickup position of the electronic part and an insert position where the electronic part is inserted into the printed circuit board, and clinch means for clinching lead wires of the electronic part, comprising the steps of:

picking up the electronic part to the head device;
   moving the electronic part to the insert position on the printed circuit board;
   inserting the lead wires into the holes of the printed circuit board;
   testing whether the lead wires are inserted into the holes;
   clinching the inserted lead wires on the basis of a test result of the testing step; and
   signaling an alarm when it is determined that the lead wires are not properly inserted in the holes of the printed circuit board.

2. A method according to claim 1, further comprising the step of allowing the head device to sequentially pick up and insert a plurality of electronic parts, and starting a pickup operation of another electronic part or an insert operation of a picked electronic part after the head device picks up at least one electronic part.

3. A head apparatus for inserting lead wires of an electronic part into a printed circuit board, comprising:

a first rotary table rotated about an axis inclined by a predetermined angle from an axis perpendicular to a surface of the printed circuit board;
   a first motor for rotating said first rotary table;
   first control means for driving said first motor to intermittently rotate said first rotary table at an insert position on the axis perpendicular to the surface of the printed circuit board and a pickup position where the part is picked up; and
   a plurality of head mechanisms mounted on said first rotary table,
   each of said plurality of head mechanisms being provided with
   a head body mounted on said first rotary table,
   gripper members mounted on said head body, and
   opening means for driving said gripper members when said head body is located at the insert position.

4. An apparatus according to claim 3, wherein said gripper members are mounted at a lower end of a hollow cylinder mounted on said head body so as to be biased in an open direction, and said opening means comprises a shaft fitted in said hollow cylinder and having a tapered portion at a distal end thereof, said gripper members being opened by said tapered portion upon sliding of said shaft.

5. An apparatus according to claim 4, further comprising:

pressing means for pushing down said head mechanism located at the insert position; and
   means for pushing down said hollow cylinder and said shaft,
   said pressing means being arranged to push down said hollow cylinder first and then insert the part gripped with said gripper members and to push down said shaft and release gripping of said gripper members.

6. An apparatus according to claim 5, wherein said pressing means comprises:
- a first roller mounted at one end of said hollow cylinder;
- a second roller mounted on one end of said shaft;
- a first drive cam mechanism for driving said first roller;
- a second drive cam mechanism for driving said second roller; and
- a second motor for driving said first and second cam mechanisms.

7. An apparatus for inserting leg portions into a printed circuit board to mount a part thereon, comprising:
- a head apparatus for holding the part and inserting the leg portions into holes in the printed circuit board,
- said head apparatus being provided with
  - gripper members for gripping or releasing the part,
  - a hollow member for holding said gripper members, and
  - means for releasing gripping of said gripper members, said releasing means being provided with a shaft fitted in said hollow member to actuate said gripper members; and
- means for moving said head apparatus to a position of the printed circuit board to drive said releasing means for the part,
- said moving means being provided with
  - a drive source for said moving means and
  - a drive cam mechanism for differentially moving said hollow member and said shaft.

8. A clinch apparatus for bending lead wires of a part upon insertion of the lead wires into holes in a printed circuit board, comprising:
- means for testing whether the lead wires are inserted into the holes in the printed circuit board, said testing means being provided with a detection member detection unit;
- retracting means, cooperating with said testing means, for retracting said testing means after said testing means completes testing;
- clinch means, connected to said testing means, for bending the lead wires after said retracting means is operated; and
- differential means, in communication with said testing means and said clinch means, for controlling said testing means and said clinch means differentially, wherein said clinch means is actuated after said retracting means, wherein said retracting means comprises:
- a support member;
- guide blocks, supported by said support member, for clamping said detection unit;
- a pair of press members, pivotally supported by said support member, for locking said guide blocks at first ends thereof; and
- a first shaft member inserted between second ends of said press member;
- said first shaft member being provided with an engaging portion engaged with said second ends of said press members to push down said guide blocks upon actuation of levers of said press members.

9. An apparatus according to claim 8, wherein said guide blocks are slid and guided by guide rods extending upright on said support member.

10. An apparatus according to claim 9, wherein said first ends of said press members have first inclined engaging portions for sliding said guide blocks along said guide rods.

11. An apparatus according to claim 8, wherein said clinch means comprises:
- a circuit board support member for supporting said printed circuit board; and
- a pair of clinch members pivotally supported by said support member, said clinch members being provided with first ends located at positions opposing lead wires of a part placed on said support member, and second ends located to oppose each other so as to interpose said first shaft member therebetween.

12. An apparatus according to claim 11, wherein said pair of clinch members and said press member are differentially operated coaxially with said support member.

13. An apparatus according to claim 12, wherein said first shaft member comprises a second engaging portion to be engaged with said second ends of said clinch members for performing a clinch operation.

14. An apparatus according to claim 13, wherein said first and second engaging portions comprise tapered portions extending in an axial direction of said first shaft member.

15. An apparatus according to claim 14, wherein said clinch driving means comprises:
- a second shaft member coupled to said support member, said second shaft member being provided with a hollow shaft which receives said first shaft member;
- first drive cam means, engaged with said first shaft, for vertically moving said first shaft member;
- second drive cam means, engaged with said second shaft member, for vertically moving said second shaft member; and
- a first motor for driving said first and second drive cam means.

16. An apparatus for inserting lead wires of a part into holes of a printed circuit board and clinching the lead wires, comprising:
- a rotary body;
- first motor means for driving said rotary body;
- a plurality of part mounting devices mounted on said rotary body, with each said part mounting device being provided with
- clinch means for bending the lead wires inserted into the holes of the printed circuit board,
- testing means, operatively associated with said clinch means, for testing if the lead wires are inserted into the holes in the printed circuit board, and
- retracting means, cooperating with said testing means, for moving said testing means to a retracted position.

17. An apparatus according to claim 16, further comprising control means for differentially driving said retracting means and said clinch means, said control means being operatively connected to said clinch means, said testing means and said retracting means.

18. An apparatus according to claim 17, further comprising:
- first drive cam means, connected to said retracting means, for driving said retracting means;
- second drive cam means, connected to said clinch means, for driving said clinch means; and
- second motor means, connected to said first and second drive cam means, for driving said first and second drive cam means.

19. An apparatus according to claim 18, further comprising:
   alarming means, connected to said testing means, for alarming a test result; and
   signal receiving means, located at a clinch position of said clinch means on an edge of said rotary body, for receiving a signal from said alarming means.

20. An apparatus according to claim 19, wherein said alarming means outputs a light signal, and said signal receiving means comprises a light-receiving element for receiving the light signal.

21. An apparatus for inserting lead wires of an electronic part into holes of a printed circuit board and bending the lead wires, comprising:
   a rotary body;
   a plurality of head devices mounted on said rotary body and moved to a pickup position for picking up the electronic part or an insert position for inserting the lead wires of the electronic part into the printed circuit board in accordance with rotation of said rotary body;
   driving means for rotating said rotary body;
   first means, connected to said rotary body, for measuring a rotation amount required to rotate a head device with the electronic part to the insert position;
   second means, connected to said rotary body, for measuring a rotation amount required for rotating said head device to the pickup position;
   first comparing means, operatively connected to said first and second measuring means, for comparing the rotation amount measured by said first measuring means with the rotation amount measured by said second measuring means; and
   controlling means, operatively connected to said first comparing means, for controlling rotation of said rotary body on the basis of a comparison result of said first comparing means.

22. An apparatus according to claim 21, wherein said plurality of head devices mounted on said rotary body are arranged in correspondence with types of electronic parts.

23. An apparatus according to claim 22, wherein said head device comprises:
   a head body mounted on said rotary body,
   a pair of gripper members for gripping the electronic part mounted on said head body, and
   releasing means, operatively associated with said gripper members, for releasing gripping of said gripper members when said head apparatus which grips said electronic part is located at the insert position; and
   driving means, connected to said head body and said releasing means, for differentially performing an insert operation and a gripping release operation when said head device gripping the electronic part is moved to the insert position.

24. An apparatus according to claim 21, further comprising:
   determining means, connected to said first and second measuring means, for determining whether the rotation amounts measured by said first and second measuring means are equal to each other; and
   preferential means, connected to said determining means, for preferentially performing a pickup operation of said head device on the basis of a signal from said determining means.

25. A clinch apparatus comprising:
   clinch elements arranged to be engaged with lead wires of an electronic part inserted into a printed circuit board;
   means for detecting completion of insertion of the lead wires into the printed circuit board;
   driving means, connected to said clinch elements, for engaging said clinch elements with the lead wires to bend the lead wires;
   control means for driving said driving means to perform a clinch operation for bending the lead wires after said detecting means detects completion of insertion, wherein said control means disables the clinch operation when said detecting means detects an insertion failure, and
   wherein said clinch elements are mounted at distal ends of upper portions of said clinch members whose intermediate portions are pivotally supported, and said driving means comprises a drive rod having one tapered surface engaged with a lower end of said clinch member to pivot said clinch member in a clinch operation direction.

26. An apparatus according to claim 25, wherein said detecting means comprises:
   a detection block, arranged to be vertically movable below the printed circuit board into which the electronic part is inserted, for detecting completion of insertion upon engagement of the lead wires from above;
   biasing means, connected to said detection block, for biasing said detection block to a position where completion of insertion of the lead wires is detected; and
   a press member, engaged with an upper portion of said detection block and pivoted in the same direction as the clinch operation direction, for pushing down said detection block against a biasing force of said biasing means.

27. An apparatus according to claim 26, wherein said press member is supported to be pivotal about an intermediate portion thereof, and said drive rod having another tapered surface engaged with a lower surface of said press member to pivot said press member in the same direction as the clinch operation direction before said one tapered surface is engaged with said lower end of said clinch member.

28. An apparatus according to claim 25, wherein said control means moves said drive rod downward when said detecting means detects the insertion failure.

29. A clinch apparatus comprising:
   a movable body arranged to be movable;
   a plurality of clinch means arranged along a moving direction of said movable body, one of said clinch means which is moved to a clinch position being operated to bend lead wires of a corresponding electronic part inserted into a printed circuit board;
   a plurality of detecting means, disposed in each said clinch means, for detecting completion of insertion of the lead wires of the corresponding electronic part into the printed circuit board;
   a plurality of light-emitting means, connected to each said detecting means, for emitting light upon completion of insertion;
   single light-receiving means, disposed across from each of said light-emitting means disposed at the clinch position, for receiving light emitted form said light-emitting means; and
   control means, connected to said light-receiving means, for performing a clinch operation of bending a corresponding lead wire by said clinch means on the basis of light reception at said light-receiving means.

30. An apparatus according to claim 29, wherein a plurality of lead wires are provided, and said detecting means enables light emission of said light-emitting means upon detection of completion of insertion of all the lead wires and inhibits light emission of said light-emitting means upon detection of an insertion failure of at least one lead wire.

31. An apparatus according to claim 29, wherein said movable body is pivotally supported, and said plurality of clinch means are arranged along an edge of said movable body at equal angular intervals.

32. An apparatus for inserting lead wires of an electronic part into holes of a printed circuit board and clinching the lead wires, comprising:

means for holding the electronic part and inserting the lead wires into the holes of the printed circuit board; and means for clinching the lead wires, said clinching means being provided with means for testing insert states of the lead wires, and means for correcting variations in lengths of the lead wires inserted into the holes of the printed circuit board.

33. An apparatus according to claim 32, further comprising means for alarming a test result of said testing means after said correcting means is operated.

34. An apparatus according to claim 33, further comprising means for inhibiting the clinch operation of said clinch means on the basis of the test result.

* * * * *

UNITED STATES PATENT AND TRADEMARK OFFICE
CERTIFICATE OF CORRECTION

PATENT NO. : 5,165,165
DATED : November 24, 1992
INVENTOR(S) : Yasushi Aoki, et al.

It is certified that error appears in the above-identified patent and that said Letters Patent is hereby corrected as shown below:

On title page, item
[56] REFERENCES CITED:

U.S. PATENT DOCUMENTS, "Shinanu et al." should read
     --Shinano et al.--, "Whittey et al." should read
     --Whitley et al.-- and "4,749,141 5/1988" should read
     --4,744,141 5/1988--.

COLUMN 10:

Line 37, "(as shown in FIG. 3A)" should be deleted.
   Line 38, "$57b_5$" should read --$57b_5$ (as shown in FIG. 3A)--.

COLUMN 11:

Line 27, "64" should be deleted.
   Line 33, "64" should be deleted.

COLUMN 28:

Line 65, "form" should read --from.

Signed and Sealed this

Eighteenth Day of January, 1994

Attest:

BRUCE LEHMAN

*Attesting Officer*     *Commissioner of Patents and Trademarks*